United States Patent
Iwamatsu et al.

(10) Patent No.: US 7,358,555 B2
(45) Date of Patent: Apr. 15, 2008

(54) SEMICONDUCTOR DEVICE

(75) Inventors: Toshiaki Iwamatsu, Tokyo (JP);
Takashi Ipposhi, Tokyo (JP);
Tatsuhiko Ikeda, Tokyo (JP); Shigeto Maegawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 159 days.

(21) Appl. No.: 11/409,040

(22) Filed: Apr. 24, 2006

(65) Prior Publication Data

US 2006/0237726 A1    Oct. 26, 2006

(30) Foreign Application Priority Data

Apr. 25, 2005    (JP)    ............... 2005-126481

(51) Int. Cl.
*H01L 27/108*    (2006.01)
(52) U.S. Cl. .............. 257/296; 257/307; 257/347; 257/E27.016
(58) Field of Classification Search ......... 257/296, 257/E27.016
See application file for complete search history.

(56) References Cited

U.S. PATENT DOCUMENTS 6,967,557 B2 *    11/2005    Hagios et al. ............... 336/200

2002/0109205 A1 *    8/2002    Sawada et al. ............ 257/532

FOREIGN PATENT DOCUMENTS

| JP | 2002-76271 | 3/2002 |
| JP | 2002-246548 | 8/2002 |

* cited by examiner

*Primary Examiner*—Tu-Tu V. Ho
(74) *Attorney, Agent, or Firm*—Oblon, Spivak, McClelland, Maier & Neustadt, P.C.

(57) ABSTRACT

While improving the frequency characteristics of a decoupling capacitor, suppressing the voltage drop of a source line and stabilizing it, the semiconductor device which suppressed decline in the area efficiency of decoupling capacitor arrangement is offered.

Decoupling capacitors DM1 and DM2 are connected between the source line connected to the pad for high-speed circuits which supplies electric power to circuit block C1, and the ground line connected to a ground pad, and the capacitor array for high-speed circuits is formed. A plurality of decoupling capacitor DM1 are connected between the source line connected to the pad for low-speed circuits which supplies electric power to circuit block C2, and the ground line connected to a ground pad, and the capacitor array for low-speed circuits is formed. Decoupling capacitor DM1 differs in the dimension of a gate electrode from DM2.

22 Claims, 26 Drawing Sheets

F I G . 5
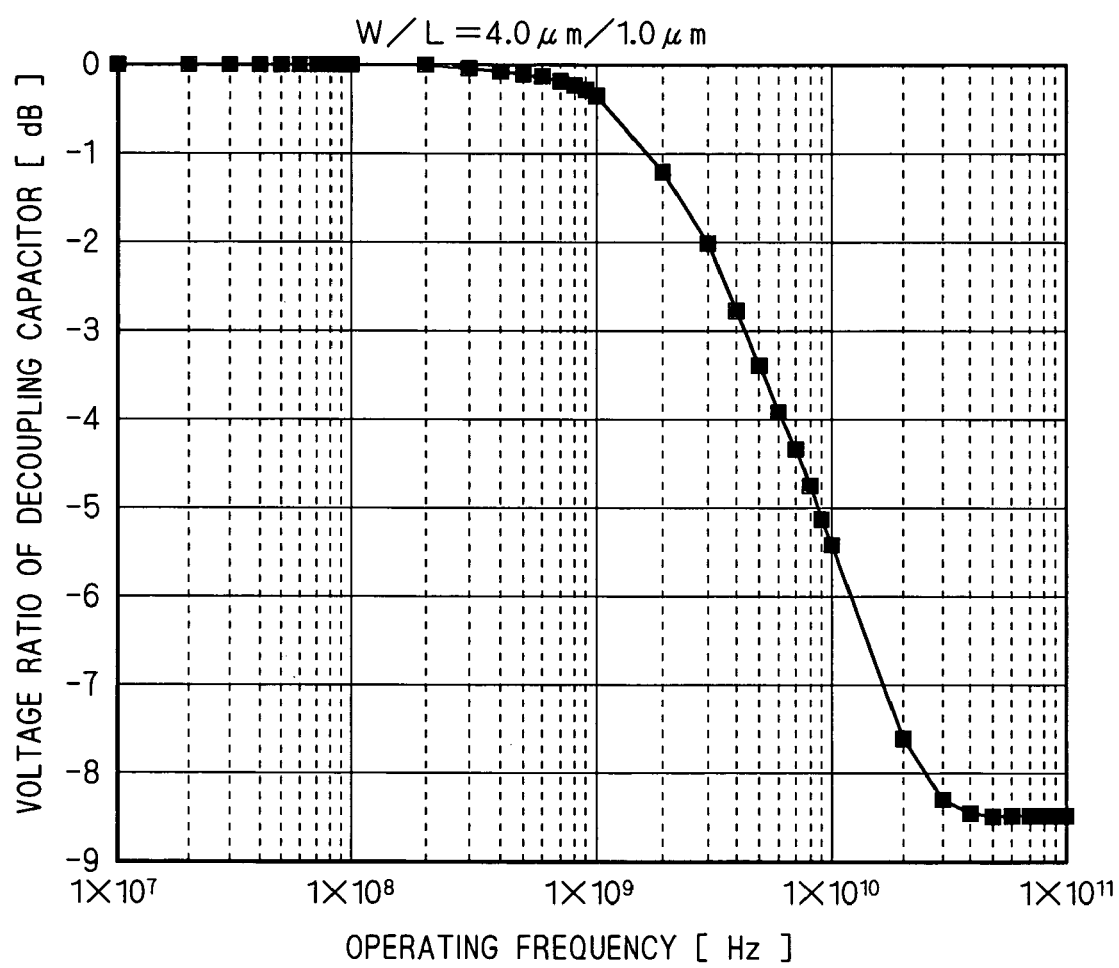

F I G . 6
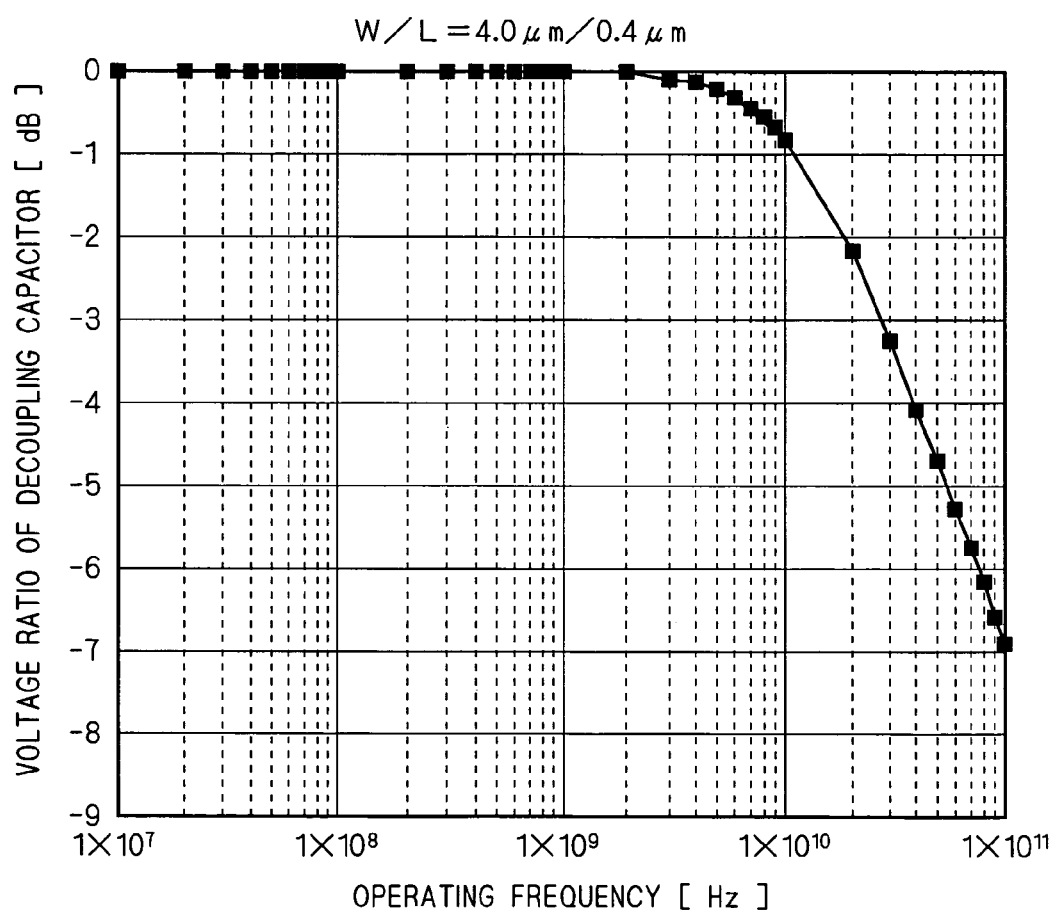

F I G . 1 1
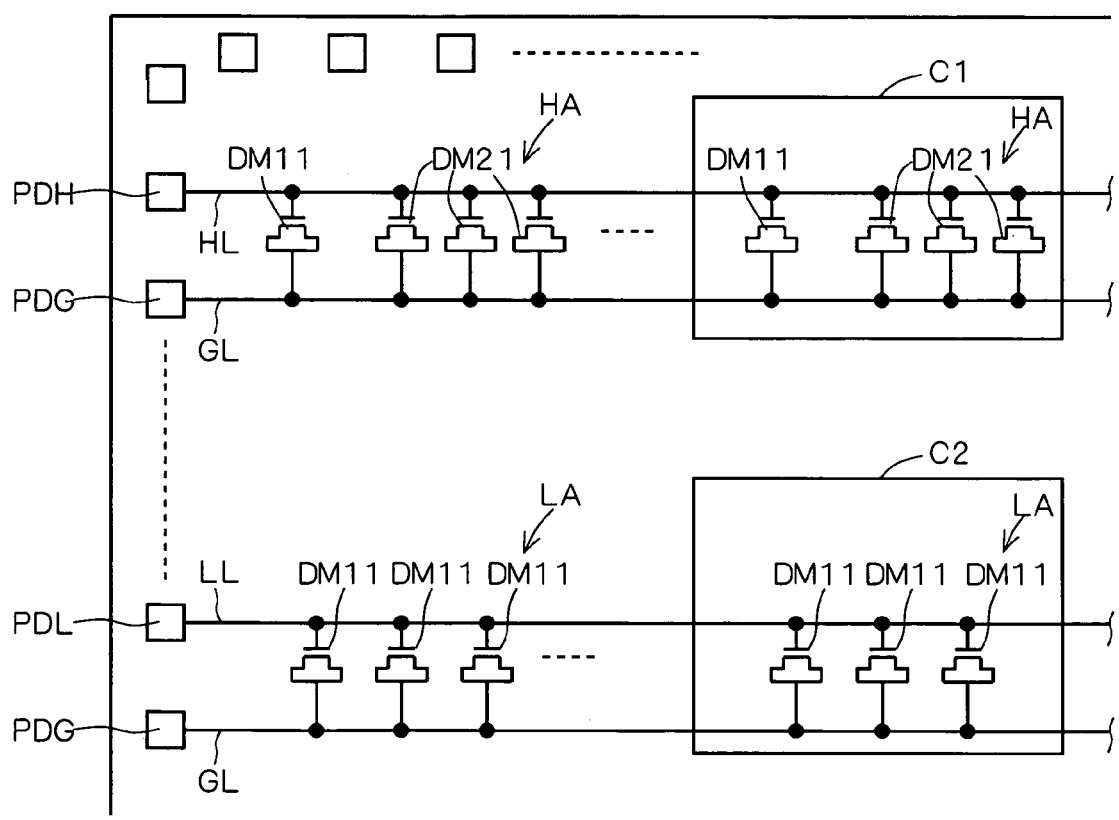

F I G. 18
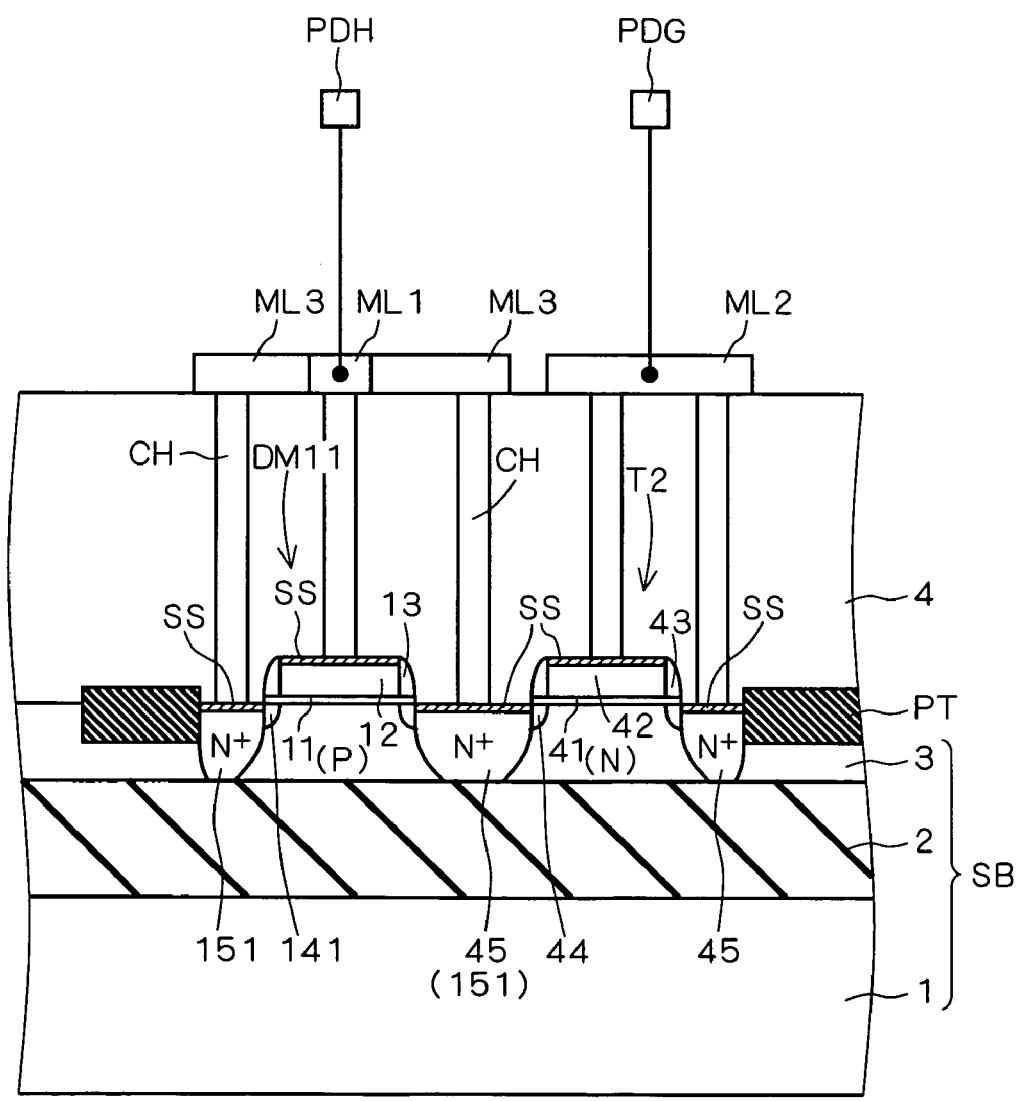

SEMICONDUCTOR DEVICE

CROSS-REFERENCE TO RELATED APPLICATION

The present application claims priority from Japanese patent application No. 2005-126481 filed on Apr. 25, 2005, the content of which is hereby incorporated by reference into this application.

FIELD OF THE INVENTION

The present invention relates to a semiconductor device, and particularly relates to a semiconductor device provided with a decoupling capacitor.

DESCRIPTION OF THE BACKGROUND ART

Recent years, development of SOC (System on a chip) structured so that it might have various functions by mounting analog/digital circuits whose operating frequency is a gigahertz (GHz) region on 1 chip is performed briskly.

In such SOC, incorporating an electronic device for measures against the noise in the circuits for stabilization of circuit operation is performed.

For example, the structure which has arranged a bypass condenser (decoupling capacitor) which has an MOS structure between a power supply wiring and a ground wiring for control of the power source noise of an external power source is shown in Patent Reference 1.

The structure which has arranged a decoupling capacitor having an MOS structure between a power supply wiring and a ground wiring is shown also in Patent Reference 2.

A decoupling capacitor is used in order to suppress rapid fluctuation of power supply voltage or to prevent local lowering of power supply voltage, and the larger the capacity is, the higher its effect of stabilizing power supply voltage is. Therefore, it is said that it is desirable to incorporate as many decoupling capacitors as possible.

[Patent Reference 1] Japanese Unexamined Patent Publication No. 2002-246548 (FIG. 4, FIG. 6)

[Patent Reference 2] Japanese Unexamined Patent Publication No. 2002-76271 (FIG. 2)

SUMMARY OF THE INVENTION

In Patent Reference 1 mentioned above, it is characterized by using a decoupling capacitor of different plane shape from the gate electrode of the so-called MOS transistor, for example, a capacitor whose electrode shape has a ring shape or a square shape, also among MOS structures. In Patent Reference 2, it is characterized by arranging an electronic element for protecting the circuit when a short circuit of a decoupling capacitor occurs, between a power supply wiring and a ground wiring with a decoupling capacitor.

As mentioned above, in recent years, operating frequency is increasing even in the GHz region and possibility that a decoupling capacitor stops functioning as a capacitor is increasing with increase of operating frequency. However, there is no such problem recognition in Patent Reference 2. Although using a decoupling capacitor from which the shape differs according to operating frequency is disclosed in Patent Reference 1, it is not the structure where the decoupling capacitor concerned was optimized.

The present invention was made in order to solve the above problems, and it aims at offering a semiconductor device which suppresses decline in the area efficiency of a decoupling capacitor arrangement while it improves the frequency characteristics of the decoupling capacitor, suppresses the voltage drop of the source line and stabilizes it in a semiconductor device whose operating frequency is a GHz region.

The semiconductor device according to claim 1 concerning the present invention comprises: a first circuit that operates on a first frequency and a second circuit that operates on a second frequency lower than the first frequency located over a semiconductor substrate; a first source line that gives operating voltage to the first circuit; a second source line that gives operating voltage to the second circuit; a ground line to which grounding electric potential is given; and at least two kinds of decoupling capacitors which are connected between the first source line and the ground line and which have an MOS structure; wherein regarding the at least two kinds of decoupling capacitors, at least one side between a gate length and a gate width of a gate electrode which forms the MOS structure is set as different length.

The semiconductor device according to claim 22 concerning the present invention comprises: a first circuit that operates on a first frequency and a second circuit that operates on a second frequency lower than the first frequency located over a semiconductor substrate; a first source line that gives operating voltage to the first circuit; a second source line that gives operating voltage to the second circuit; a ground line to which grounding electric potential is given; a first decoupling capacitor that is connected between the first source line and the ground line and that has an MOS structure; and a second decoupling capacitor that is connected between the second source line and the ground line and that has an MOS structure; wherein the first decoupling capacitor is set up so that at least one side of a gate length and a gate width of a gate electrode which form the MOS structure is smaller than the second decoupling capacitor.

According to the semiconductor device according to claim 1 concerning the present invention, since in one side of at least two kinds of decoupling capacitors, at least one side of the gate length and the gate width of the gate electrode which forms the MOS structure is set to the different length, the voltage drop of the first source line can be suppressed by having the decoupling capacitor concerned, and the decline in the area efficiency in the case of locating the decoupling capacitor on a semiconductor substrate can be suppressed by using together at least two kinds of decoupling capacitors.

According to the semiconductor device according to claim 22 concerning the present invention, since at least one side of the gate length and the gate width of the first decoupling capacitor is set up as smaller than the second decoupling capacitor, the voltage drop of the first source line where the operating voltage of the first frequency higher than the second frequency is given can be suppressed effectively.

BRIEF DESCRIPTION OF THE DRAWINGS

FIGS. 5 to 7 are drawings showing the frequency characteristics of the voltage ratio of a decoupling capacitor;

FIG. 11 is a plan view showing the structure of Modification 2 of the semiconductor device of the embodiment concerning the present invention;

FIG. 18 is a sectional view showing the third structure of Modification 3 of the semiconductor device of the embodiment concerning the present invention;

DETAILED DESCRIPTION OF THE PREFERRED EMBODIMENTS

Embodiment

A. Device Structure

Figure 1:
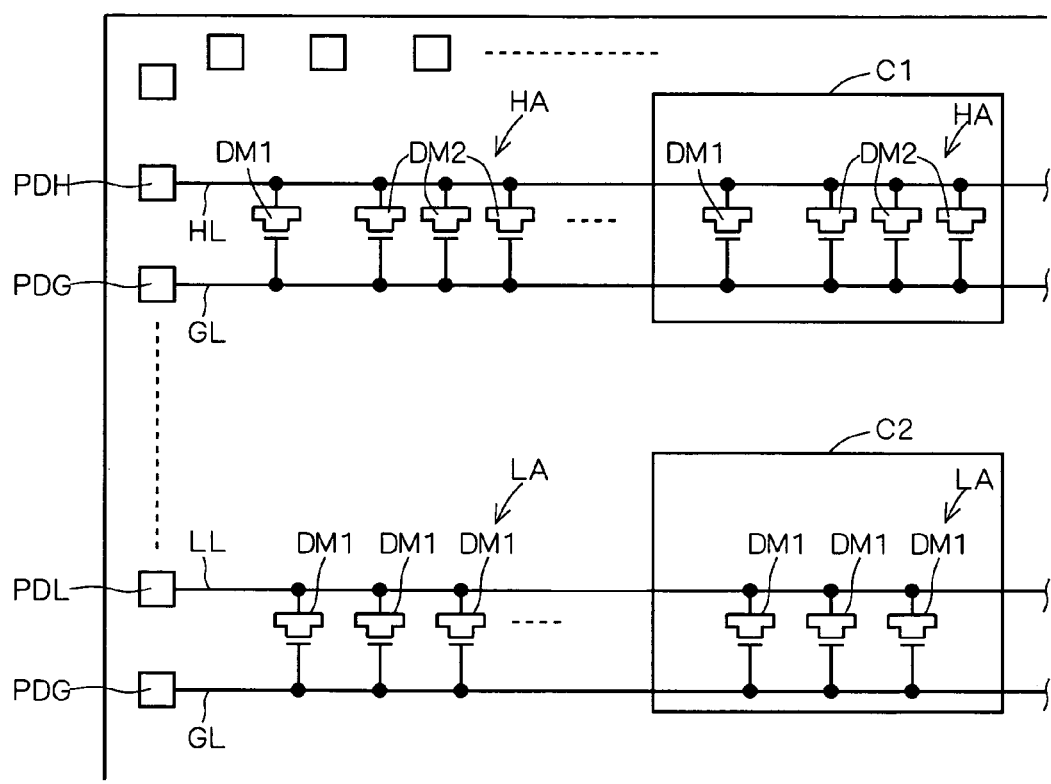
FIG. 1 is a plan view showing the structure of the semiconductor device of the embodiment concerning the present invention.

FIG. 1 is a plan view showing arrangement of the decoupling capacitor of the embodiment concerning the present invention. FIG. 1 is a plan view showing a part of SOC packages, and a plurality of I/O pads are arranged along the package edge part. Among these, power supply pads from an external power source comprise pad PDH for high-speed circuits which supplies operating voltage to circuit block C1 (first circuit) which makes high-speed operation with comparatively high operating frequency (for example, 3 GHz or more), pad PDL for low-speed circuits which supplies operating voltage to circuit block C2 (second circuit) which makes low speed operation with comparatively low operating frequency (for example, less than 3 GHz), and ground pad PDG connected to grounding electric potential.

As shown in FIG. 1, while decoupling capacitors DM1 and DM2 are arranged in the region which is called the so-called open area on a semiconductor substrate, and which is except the region where circuit blocks C1 and C2 are arranged, decoupling capacitors DM1 and DM2 are arranged also in circuit blocks C1 and C2.

In detail, decoupling capacitors DM1 and DM2 being connected between source line HL connected to pad PDH for high-speed circuits which supplies electric power to circuit block C1, and ground line GL connected to ground pad PDG, capacitor array HA for high-speed circuits is formed. A plurality of decoupling capacitors DM1 being connected between source lines LL connected to pad PDL for low-speed circuits which supplies electric power to circuit block C2, and ground line GL connected to ground pad PDG, capacitor array LA for low-speed circuits is formed. In addition, decoupling capacitors DM1 and DM2 which form capacitor array HA for high-speed circuits may be one piece each, and may be two or more each, respectively. Decoupling capacitor DM1 which forms capacitor array LA for low-speed circuits may be one piece, and may be plural. It is called as an array even if it is one piece.

Decoupling capacitors DM1 and DM2 are capacitors (MOS capacitors) which have the so-called MOS structure, and the gate insulating film of a MOS transistor functions as a dielectric film of a capacitor. And decoupling capacitors DM1 and DM2 have the structure that the gate electrode is connected to ground line GL, and the source/drain electrode is connected to source line HL, in both capacitors. Although decoupling capacitor DM1 differs in the dimension of the gate electrode from decoupling capacitor DM2, this is explained in detail later.

As shown in FIG. 1, while capacitor array HA for high-speed circuits includes two kinds of capacitors of decoupling capacitors DM1 and DM2, capacitor array LA for low-speed circuits includes one kind of capacitor of decoupling capacitor DM1.

Since the voltage of the frequency of a GHz region is received even if it is circuit block C2 which makes low speed operation with comparatively low operating frequency, it is effective to connect decoupling capacitor DM1 to source line LL, and to stabilize voltage.

In FIG. 1, although the structure which has arranged a plurality of decoupling capacitors DM2 to parallel is disclosed to decoupling capacitor DM1 being one piece in capacitor array HA for high-speed circuits, both number of pieces is not limited to this.

Here, the same voltage is given to pad PDH for high-speed circuits, and pad PDL for low-speed circuits although frequencies differ. When the voltage concerned is 1.2 V, the thickness of the dielectric film of decoupling capacitors DM1 and DM2 is set as about 2 nm. The gate insulating film of the MOS transistor formed in circuit blocks C1 and C2 is also set as the same thickness as this.

When the voltage given to pad PDH for high-speed circuits and pad PDL for low-speed circuits is 3.3 V, the thickness of the dielectric film of decoupling capacitors DM1 and DM2 is set as about 8 nm, and the gate insulating film of the MOS transistor formed in circuit blocks C1 and C2 is also set as the same thickness as this.

In the following explanation, it is explained under the condition that the voltage of 1.2 V is given to pad PDH for high-speed circuits, and pad PDL for low-speed circuits.

Figure 2:
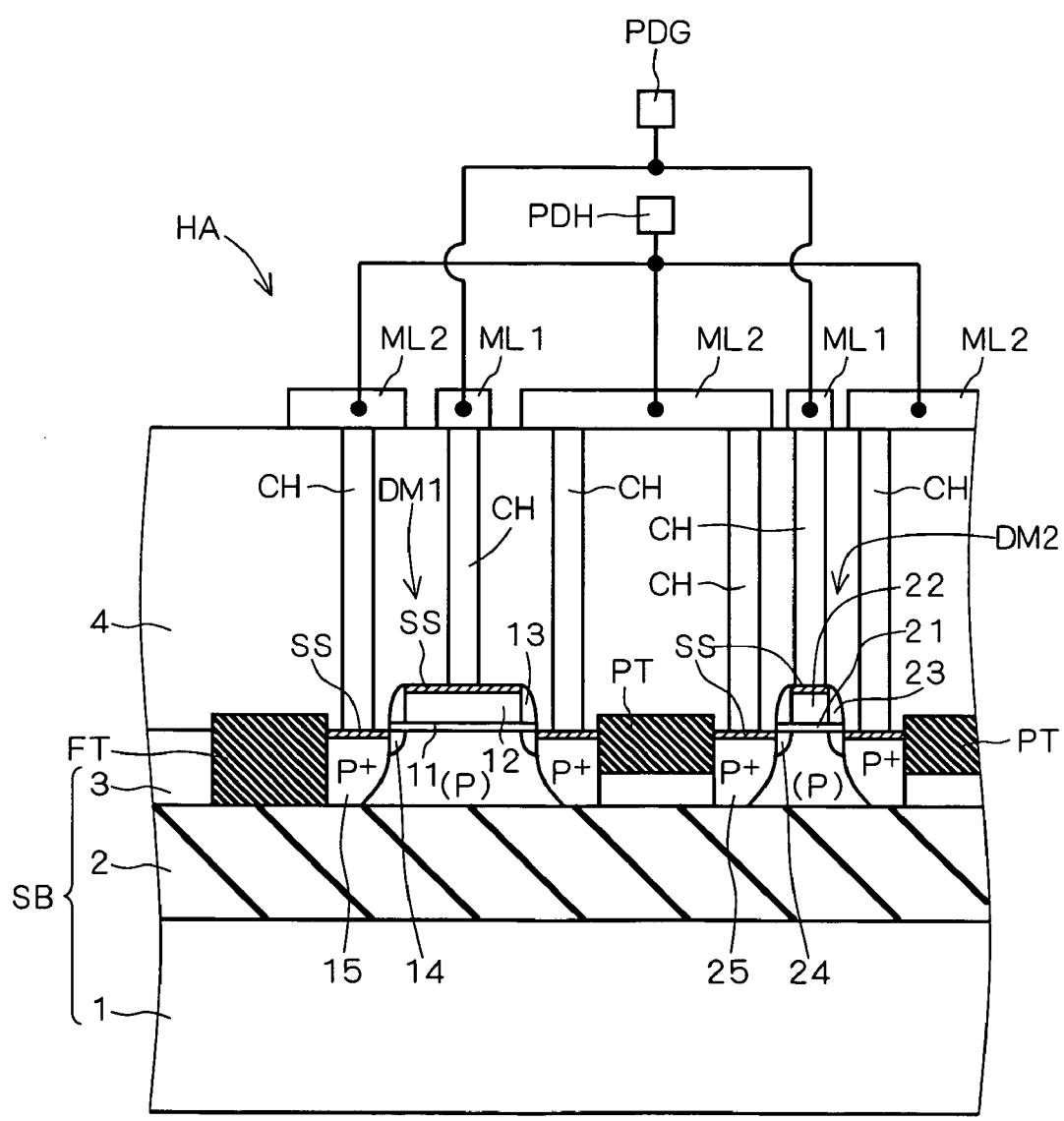
FIG. 2 is a sectional view showing the structure of the semiconductor device of the embodiment concerning the present invention.
Figure 3:
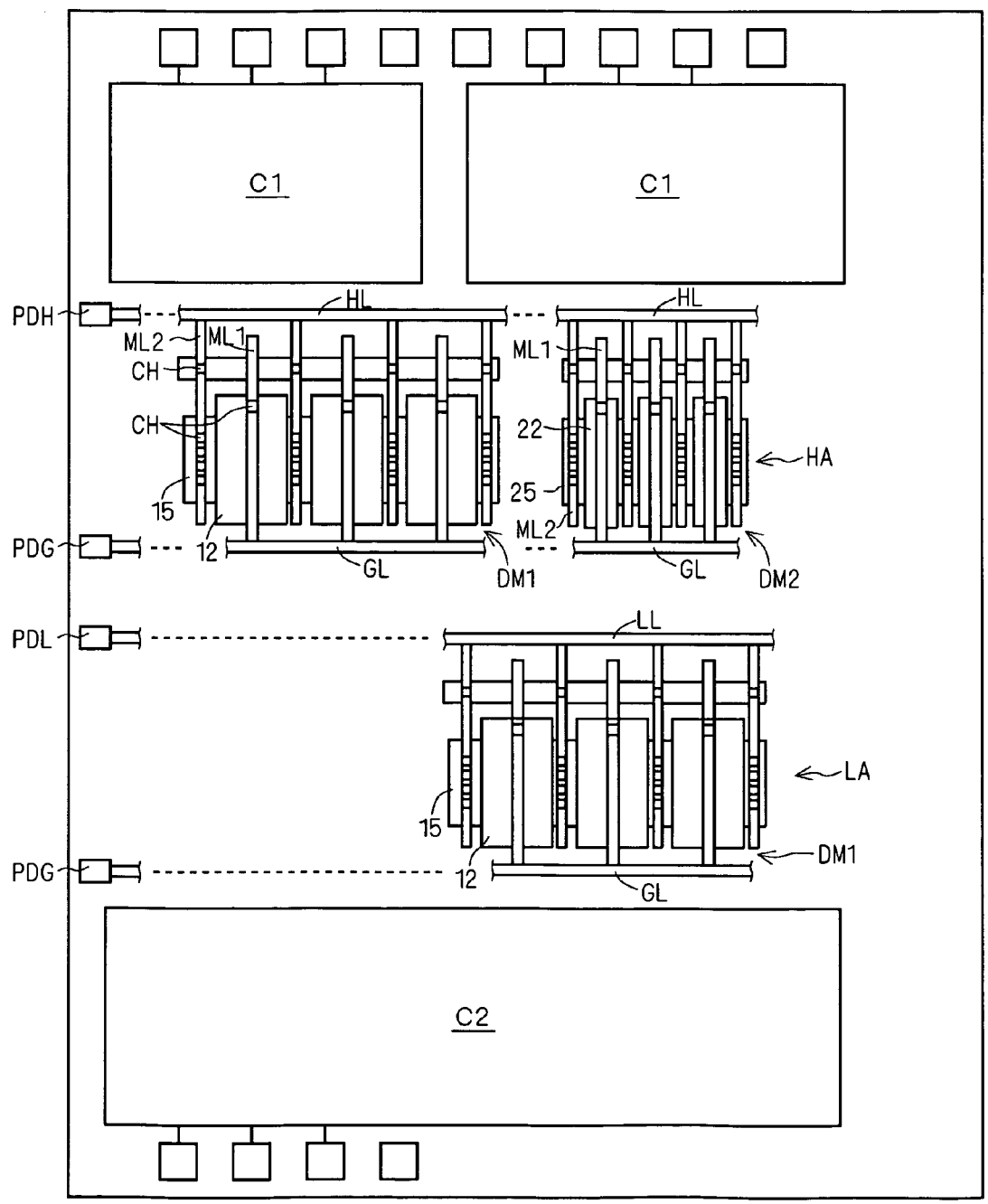
FIG. 3 is a plan view showing an example of the arrangement of the capacitor array for high-speed circuits, and the capacitor array for low-speed circuits.

Next, the structure in an element level of capacitor array HA for high-speed circuits is explained using FIG. 2 and FIG. 3.

FIG. 2 is a partially sectional view showing an example of the structure of capacitor array HA for high-speed circuits, and shows one decoupling capacitor DM1 and DM2 at a time, respectively. About the cross-section structure of decoupling capacitor DM1 which forms capacitor array LA for low-speed circuits, it is the same as decoupling capacitor DM1 shown in FIG. 2, and illustration etc. is omitted.

As shown in FIG. 2, capacitor array HA for high-speed circuits is located on SOI substrate SB which comprises silicon substrate 1, buried oxide film 2 located on the silicon substrate 1 concerned, and SOI layer 3 located on buried oxide film 2.

SOI substrate SB uses both full trench isolation insulating layer FT formed by forming the trench which reaches buried oxide film 2 in the front surface of SOI layer 3, and embedding an insulating material in this trench, and partial trench isolation insulating layer PT which formed the trench in the front surface of an SOI layer so that SOI layer 3 of prescribed thickness might remain between the bottom of a trench, and buried oxide film 2, and was formed by embedding an insulating material in this trench. Between decoupling capacitors DM1 and DM2, partial trench isolation insulating layer PT separates. On the other hand, full trench isolation insulating layer FT electrically separates thoroughly between capacitor array HA for high-speed circuits, and another portions.

As shown in FIG. 2, decoupling capacitor DM1 is provided with gate insulating film 11 selectively located on SOI layer 3, gate electrode 12 located on gate insulating film 11, and sidewall insulating layer 13 which covers the side surface of gate electrode 12.

Source/drain layer 15 is located in the front surface of SOI layer 3 of the outside of sidewall insulating layer 13 of decoupling capacitor DM1, and extension layer 14 is located at the location shallower than source/drain layer 15.

And silicide film SS is located at source/drain layer 15 upper part and the upper surface of gate electrode 12.

Here, source/drain layer 15 includes P type impurity in high concentration ($P^+$) comparatively, and the region (body region) of SOI layer 3 located between source/drain layers 15 includes P type impurity by concentration lower than source/drain layer 15. Decoupling capacitor DM1 is an accumulation type MOS capacitor in which a carrier accumulates in the front surface of the body region near the interface with gate insulating film 11 at the time of gate voltage application.

Decoupling capacitor DM2 is provided with gate insulating film 21 selectively located on SOI layer 3, gate electrode 22 located on gate insulating film 21, and sidewall insulating layer 23 which covers the side surface of gate electrode 22.

Source/drain layer 25 is located in the front surface of SOI layer 3 of the outside of sidewall insulating layer 23 of decoupling capacitor DM2, and extension layer 24 is located at the location shallower than source/drain layer 25.

And silicide film SS is located at source/drain layer 25 upper part and the upper surface of gate electrode 22.

Here, source/drain layer 25 includes P type impurity in high concentration ($P^+$) comparatively, and the body region located between source/drain layers 25 includes the P type impurity by concentration lower than source/drain layer 15. Decoupling capacitor DM2 is an MOS capacitor of an accumulation type in which a carrier accumulates in the front surface of the body region near the interface with gate insulating film 21 at the time of gate voltage application.

Here, extension layers 14 and 24 are impurity layers formed so that they may become junction shallower than a source/drain layer, and are the same conductivity type as a source/drain layer. Since it functions as a source/drain layer, it should be called the source/drain extension layer, but it is called as extension layer for convenience.

And interlayer insulation film 4 which comprises, for example a silicon oxide layer is located so that the SOI substrate SB upper part whole region may be covered, a plurality of contact parts CH are formed so that they may connect with gate electrodes 12 and 22 and source/drain layers 15 and 25, penetrating interlayer insulation film 4. Source/drain layers 15 and 25 are connected to wiring ML2 via contact parts CH, and gate electrodes 12 and 22 are connected to wiring ML1 via contact parts CH.

And wiring ML1 is electrically connected to ground pad PDG, and wiring ML2 is electrically connected to pad PDH for high-speed circuits.

Although contact part CH connected to gate electrode 12 and gate electrode 22 does not appear on the same sectional view as another contact parts, it is drawn with a solid line for convenience. Similarly, also in wirings ML1 and ML2, although there is a portion which does not appear on the same sectional view, it is drawn with a solid line for convenience.

Although an interlayer insulation film is further formed on interlayer insulation film 4 at a multilayer, in FIG. 2, illustration is omitted for simplification.

As shown in FIG. 2, the gate length of gate electrode 12 of decoupling capacitor DM1 is formed longer than the gate length of gate electrode 22 of decoupling capacitor DM2.

Here, as an example, the gate length (L) and gate width (W) of gate electrode 12 are set to 1.0 µm and 4.0 µm, respectively, and the gate length (L) and gate width (W) of gate electrode 22 are set to 0.1 µm and 4.0 µm, respectively. The thickness of gate insulating films 11 and 21 is 2 nm as explained previously.

FIG. 3 is a plan view showing an example of the arrangement at the time of seeing capacitor array HA for high-speed circuits and capacitor array LA for low-speed circuits which were shown in FIG. 1 from the gate electrode upper part. In FIG. 3, between decoupling capacitors DM1 and between decoupling capacitors DM2, a partial trench isolation insulating layer as shown in FIG. 2 is not formed, but uses a source/drain layer in common by adjacent decoupling capacitors. Hereby, area efficiency can be raised more. In FIG. 3, the same numerals are given to the fundamentally same structure with FIG. 2, and the overlapping explanation is omitted.

As shown in FIG. 3, each gate electrode 12 and 22 of decoupling capacitors DM1 and DM2 is making long and slender rectangular shape like the gate electrode of a MOS transistor. Outside the longitudinal side surface of gate electrodes 12 and 22, source/drain layers 15 and 25 also become a pair, and are formed in the way like the source/drain layer of a MOS transistor.

Figure 4:
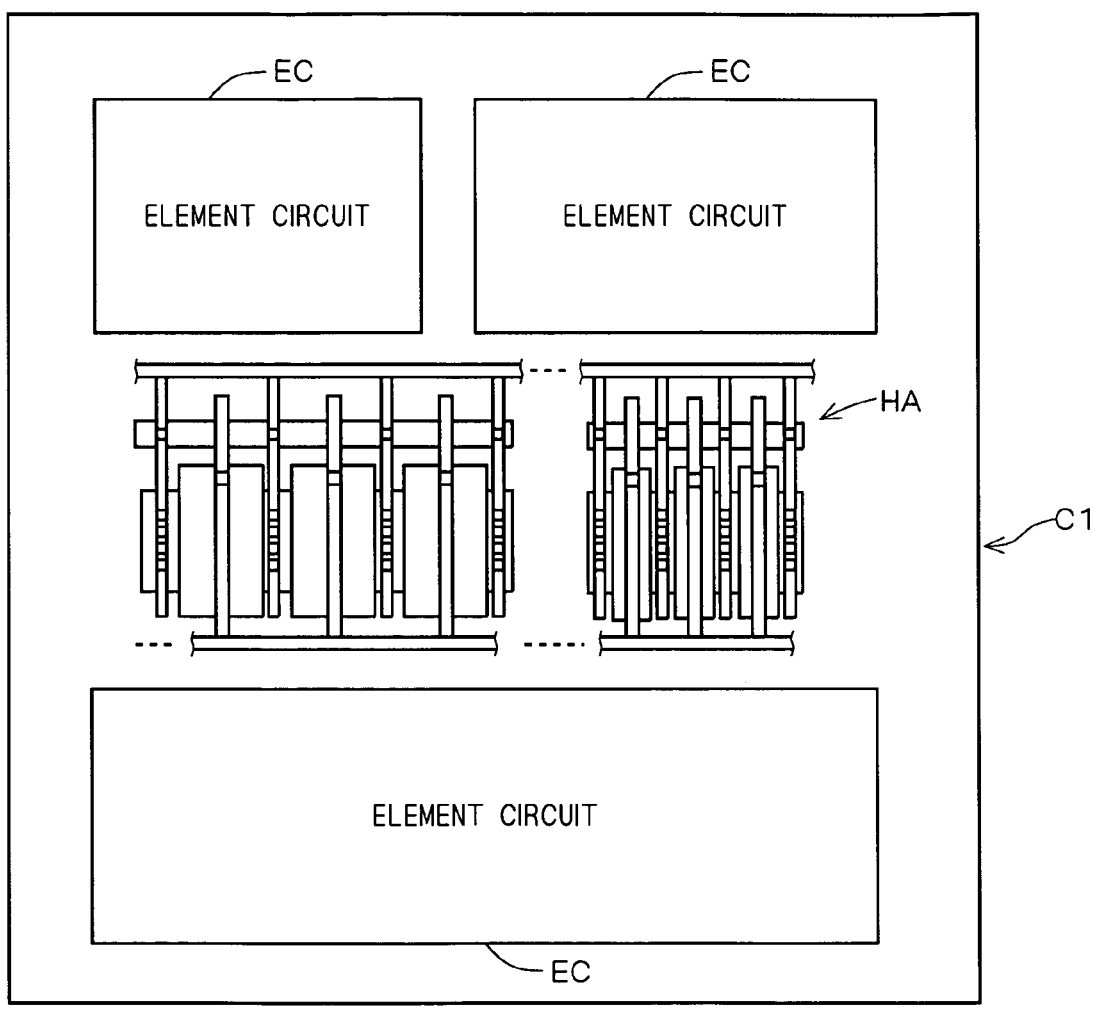
FIG. 4 is a plan view showing an example of the arrangement of the capacitor array for high-speed circuits in a circuit block.

An example of the structure in circuit block C1 is shown in FIG. 4. As shown in FIG. 4, in circuit block C1, a plurality of circuit parts with a respectively proper function called element circuit EC will exist, and one circuit block C1 will operate in such element circuit EC operating. This is the same also in circuit block C2.

And capacitor array HA for high-speed circuits is located at the open area between element circuits EC. In circuit block C2, it is needless to say that capacitor array LA for low-speed circuits is located.

Hereby, the open area of the semiconductor substrate can be used effectively and it can be prevented that the arrangement number of a decoupling capacitor runs short.

Source line HL and ground line GL are connected to each element circuit EC, and capacitor array HA for high-speed circuits is connected to source line HL and ground line GL, respectively. In that case, it is desirable to arrange a decoupling capacitor with short gate length in the location near element circuit EC. Hereby, the effect of voltage stability of source line HL is made to a more sure thing.

B. Device Operation

As explained above, capacitor array HA for high-speed circuits has two kinds of capacitors with which gate length is different each other as decoupling capacitors DM1 and DM2. The reason for taking such structure is explained based on operation of decoupling capacitors DM1 and DM2.

Figure 7:
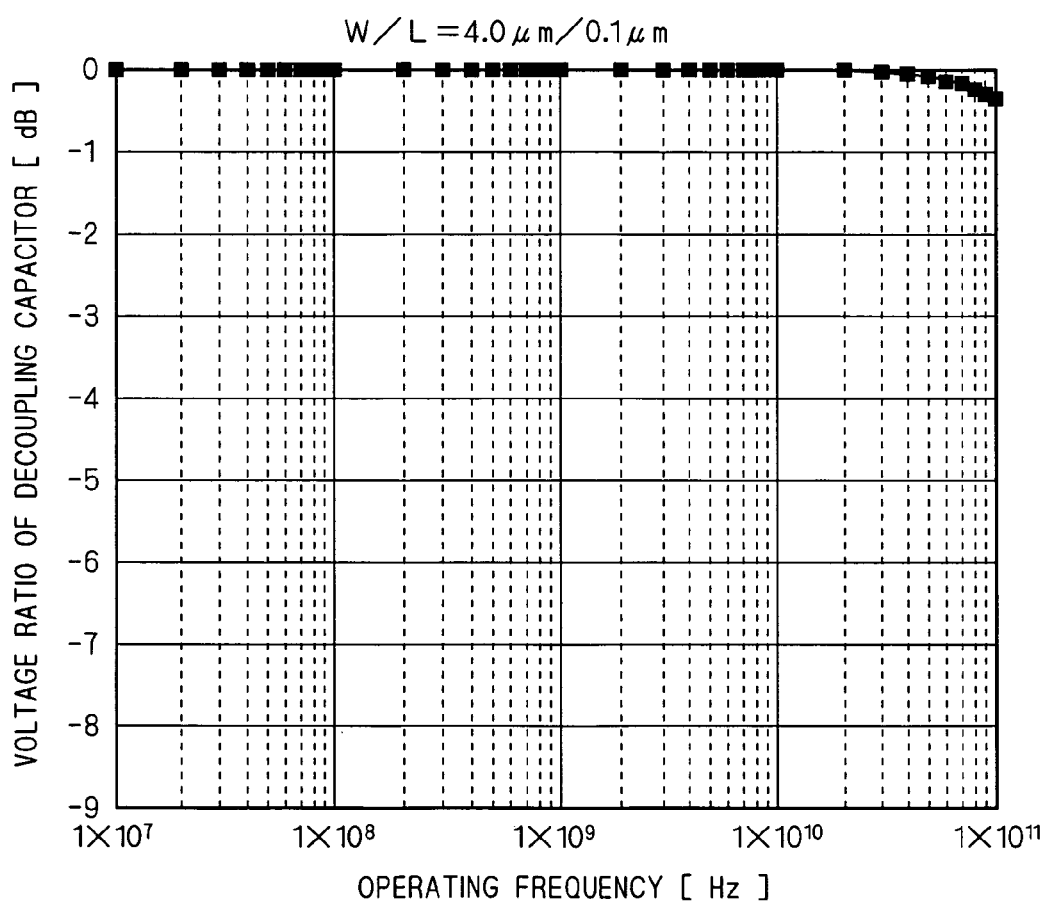

The frequency characteristics of the voltage ratio of the decoupling capacitor at the time of changing gate length are shown in FIG. 5-FIG. 7. Here, the voltage ratio of a decoupling capacitor is the value showing the ratio of the terminal voltage of the decoupling capacitor at the time of giving the voltage of a predetermined power supply frequency, and the terminal voltage of the decoupling capacitor at the time of giving the voltage of a very low frequency which is almost close to a direct current to a decoupling capacitor. The denominator is made into the voltage value at the time of giving the frequency near a direct current, the numerator is made into the voltage value of a certain power supply frequency, and the characteristics (simulation result) obtained by having changed various values of the power supply frequency are shown in FIG. 5-FIG. 7.

FIG. 5-FIG. 7 show the simulation result in the range of $1 \times 10^7$ to $1 \times 10^{11}$ Hz assumed as operating frequency of a circuit block as a power supply frequency. The horizontal axis shows operating frequency (Hz) and the vertical axis shows the voltage ratio (dB) of the decoupling capacitor. In the vertical axis, 0 dB shows the case where a voltage ratio is 100%, namely the case where a decoupling capacitor functions 100% as a capacity component, and it is shown that the resistance component of a decoupling capacitor becomes large as a voltage ratio increases to a negative direction.

FIG. 5 shows the frequency characteristics of the decoupling capacitor in the case where gate length (L) and gate width (W) are 1.0 μm and 4.0 μm, respectively. Although the voltage ratio is 0 dB in a comparatively low frequency domain, i.e., a $1 \times 10^7$ to $1 \times 10^8$ Hz region, when it exceeds $1 \times 10^8$ Hz (0.1 GHz), the voltage ratio will begin lowering, in $3 \times 10^9$ Hz (3 GHz), lowering of −2 dB is shown and $1 \times 10^{10}$ Hz (10 GHz) shows lowering over −5 dB.

As explained previously, lowering of a voltage ratio means the increase in a resistance component, and it means that the function to store the charge of a capacitor decreases and charge flows out, i.e., a current flows and voltage decreases.

FIG. 6 shows the frequency characteristics of the decoupling capacitor in the case where gate length (L) and gate width (W) are 0.4 μm and 4.0 μm, respectively. The voltage ratio is maintaining 0 dB in a $1 \times 10^7$ to $1 \times 10^9$ Hz region, and it turns out that the frequency dependency has been improved compared with the case where gate length is 1.0 μm. However, when it exceeds $1 \times 10^9$ Hz (1 GHz), the voltage ratio will begin lowering.

FIG. 7 shows the frequency characteristics of the decoupling capacitor in the case where gate length (L) and gate width (W) are 0.1 μm and 4.0 μm, respectively. The voltage ratio is maintaining 0 dB in a $1 \times 10^7$ to $1 \times 10^{10}$ Hz region, and it turns out that the frequency dependency has been improved further compared with the case where gate length is 0.4 μm.

Thus, the dependency over a power supply frequency is improved by narrowing gate length of a decoupling capacitor, and it turns out that the performance as a capacitor is maintainable in a wide frequency domain.

Therefore, by connecting the decoupling capacitor of, for example gate length 0.4 μm, more desirably gate length 0.1 μm to the source line connected to circuit block C1 which operates with comparatively high operating frequency (for example, 3 GHz or more), the voltage drop of the source line can be prevented. However, the area of a gate insulating film, i.e., the dielectric film of a capacitor, decreases, and the capacitor capacity decreases because gate length becomes narrow.

In order to increase the capacitor capacity, it is possible to make thickness of the gate insulating film thin, but since it is prescribed by the voltage applied to the gate electrode, the thickness of the gate insulating film cannot be changed extremely.

Although the capacitor capacity will be maintained by increasing the number of a decoupling capacitor as a result, when gate length's narrow decoupling capacitor is increased, the area efficiency of decoupling capacitor arrangement will decrease.

That is, when gate width is the same, the area of the gate electrode of the decoupling capacitor of gate length 0.1 μm will become small to ¹/₁₀ in gate length 1.0 μm. Therefore, in order to obtain the same capacitor capacity as one decoupling capacitor of gate length 1.0 μm, ten decoupling capacitors of gate length 0.1 μm are needed.

However, when adopting an MOS structure, it is necessary to form a source/drain layer in each decoupling capacitor, and the source/drain layer is not concerned with gate length's length, but a predetermined area is required. Therefore, the latter case of capacitor needs a far large occupation area by the case where one decoupling capacitor of gate length 1.0 μm is formed, and the case where ten decoupling capacitors of gate length 0.1 μm are formed.

As a result, the area efficiency of decoupling capacitor arrangement may decrease and it may be said that the capacitor capacity set up in the design stage cannot be attained.

Then, taking area efficiency and frequency characteristics into consideration, we decided to form capacitor array HA for high-speed circuits from two kinds of capacitors of decoupling capacitors DM1 and DM2.

About decoupling capacitor DM1, when, for example gate length of decoupling capacitor DM1 is set to 0.4 μm and gate length of decoupling capacitor DM2 is set to 0.1 μm, when a power supply frequency is to about 10 GHz, lowering of a voltage ratio is about −1 dB, and can be permitted.

On the other hand, in decoupling capacitor DM2, since a voltage ratio does not decrease until a power supply frequency is 10 GHz, it does not become a problem. By using together decoupling capacitors DM1 and DM2, when seeing the whole capacitor array HA for high-speed circuits, the voltage drop of the source line can be suppressed compared with the case where only decoupling capacitor DM1 is used.

Compared with the case where only decoupling capacitor DM2 is used, decline in area efficiency can be suppressed by using together decoupling capacitors DM1 and DM2. Therefore, the situation where the capacitor capacity set up in the design stage is no longer obtained to capacitor array HA for high-speed circuits can be prevented.

What is necessary is just to make still narrower each gate length of decoupling capacitors DM1 and DM2, when a power supply frequency exceeds 10 GHz. On the contrary, when a power supply frequency is 1 GHz or less, gate length of decoupling capacitor DM1 can be set to 1.0 μm, and gate length of decoupling capacitor DM2 can also be set to 0.4 μm.

Like the case of setting gate length of decoupling capacitor DM1 to 1.0 μm, and setting gate length of decoupling capacitor DM2 to 0.1 μm, it may be set up so that both may differ greatly. That is, when called the circuit whose operating frequency is 10 GHz, the maximum frequency is 10 GHz. Since it may operate on a frequency lower than it, the combination of decoupling capacitors which have a big difference to gate length is also effective.

As for capacitor array LA for low-speed circuits, when the gate length of decoupling capacitor DM1 is set to 0.4 μm, the case where circuit block C2 operates with the operating frequency of 10 GHz or less can be dealt with, and it is not necessary to use together the decoupling capacitor which shortened gate length.

Although the case where the thickness of gate insulating films 11 and 21 was 2 nm was explained in the above, since the frequency characteristics of decoupling capacitors DM1 and DM2 also change when the thickness of gate insulating films 11 and 21 changes (i.e., when power supply voltage changes), it is needless to say that each gate length is set up based on the frequency characteristics concerned.

In decoupling capacitors DM1 and DM2, although gate lengths differed, gate widths were set up similarly. By doing in this way, a clearance can be lessened, it can be arranged efficiently and area efficiency can be raised.

The reason which changes frequency characteristics by gate length can be explained as follows. That is, the resistance component of the insulating layer of a decoupling capacitor has a frequency dependency. Although a capacitor accumulates sufficient charge and functions as capacity in the region where a frequency is low in comparison, when a frequency becomes high, accumulating of charge will become insufficient, and it becomes like resistance.

Therefore, although voltage can be maintained between the terminals of a capacitor in a comparatively low frequency domain ($1 \times 10^7$ to $1 \times 10^8$ Hz) as shown in FIG. 5, when a frequency becomes high, it becomes impossible to maintain the voltage. Such a decrease of the voltage in the region where a frequency is high also depends on capacitor size, and it originates in parasitic resistance (this is explained using FIG. 8) of gate resistance etc. in a decoupling capacitor. That is, the performance of a decoupling capacitor is decided by resistance classified into two kinds (parasitic resistance, and resistance depending on the frequency of the capacitor). Hereafter, the detail of parasitic resistance is explained.

Figure 8:
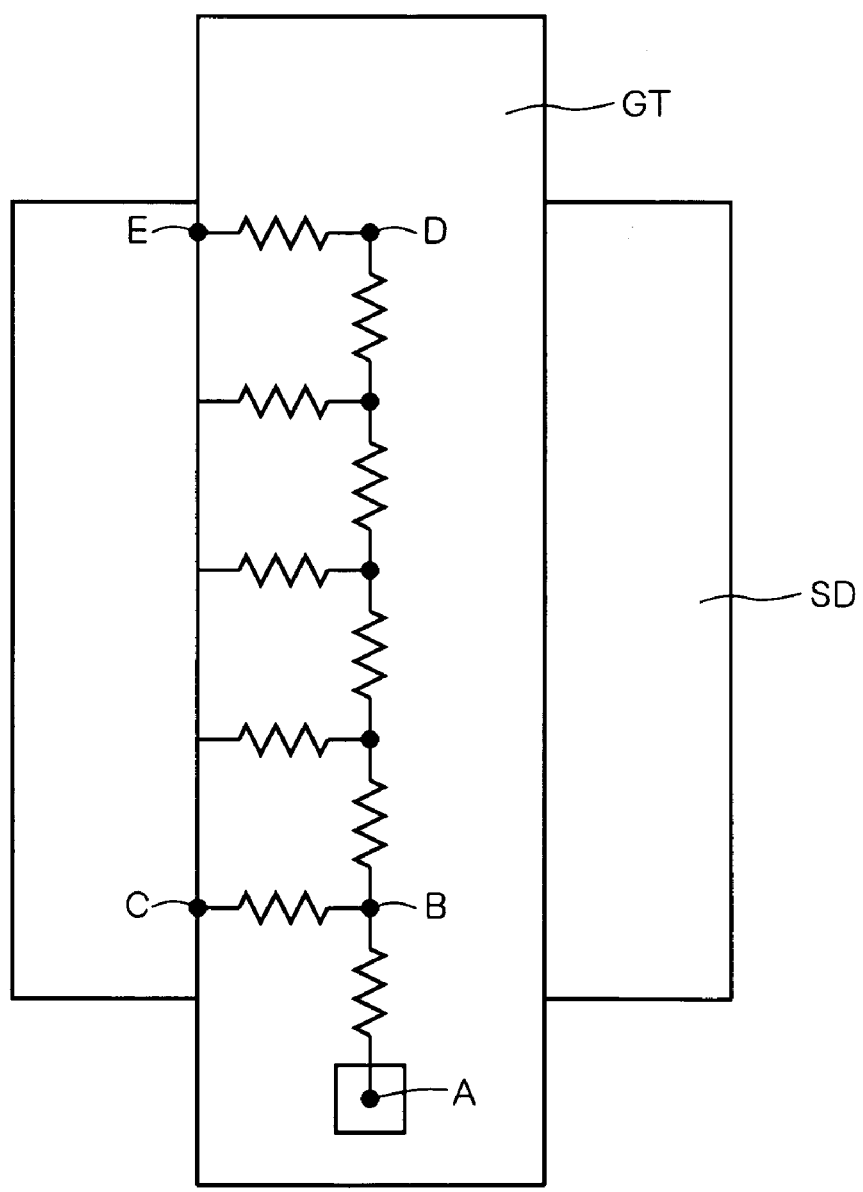
FIG. 8 is a drawing showing the resistance component in a gate electrode portion schematically.

FIG. 8 is a drawing showing the resistance components in the gate electrode portion schematically. The contact part formed in the one side end of the long-side direction of gate electrode GT is made into A point, and about the resistance to B point, C point, D point, and E point in gate electrode GT are argued.

Here, A point is located not on the so-called active region but on an isolation insulating layer, and B point-E point are points on the active region. B point and D point are points on gate electrode GT, B point is a point nearest to the contact part A point, and D point is the furthest point from the contact part A point. C point and E point are points on source/drain layer SD under the gate insulating film, and assume the location respectively nearest to the side surface of gate electrode GT.

The resistance between AC is decided by the resistance between AB (namely, resistance on gate electrode GT), and the resistance between BC (resistance on the active region under the gate insulating film). The resistance between AE is decided by the resistance between AD (namely, resistance on gate electrode GT), and the resistance between DE (resistance on the active region under the gate insulating film). It is clear that the resistance between AE becomes higher than the other between both. For this reason, the voltage drop near the E point becomes larger than the voltage drop near the C point, and this will become more remarkable when the frequency of voltage becomes high.

In order to suppress this voltage drop, it is effective to lower the resistance between AD or to lower the resistance between DE, and taking the former will shorten gate width and taking the latter will shorten gate length.

Here, since the resistance on the active region under a gate insulating film (resistance of a body region in an accumulation type, and resistance of an inversion layer in an inversion type) is larger than the resistance on a gate electrode, the way which shortens gate length is effective in respect of suppression of a voltage drop.

Thus, resistance becomes small effectively by shortening gate length, and the voltage drop of a source line will be suppressed, as a result frequency characteristics will also change.

FIG. 5-FIG. 7 showed the frequency characteristics of the voltage ratio of the decoupling capacitor at the time of fixing gate width and changing gate length. However, even when gate length is fixed and gate width is changed, it is needless to say that the frequency characteristics of the voltage ratio of a decoupling capacitor are improvable by shortening gate width.

In this case, since gate length is fixed, a clearance can be lessened and it can be arranged efficiently, and area efficiency can be raised.

Also in the structure which fixed the gate length of the decoupling capacitor and changed gate width, when locating in a circuit block, it is desirable to arrange the decoupling capacitor with short gate width so that it may become a location near an element circuit. Hereby, the effect of voltage stability of a source line is made a more sure thing.

As explained above, in order to suppress the voltage drop in a gate electrode, it is effective to shorten gate length. However, when gate length's narrow decoupling capacitor is increased, the area efficiency of decoupling capacitor arrangement will decrease. Then, it is a point of the present invention to use together gate length's narrow decoupling capacitor and gate length's wide decoupling capacitor. It is effective to use the decoupling capacitor which made wide not only gate length but gate width in the point that area efficiency is raised.

Figure 9:
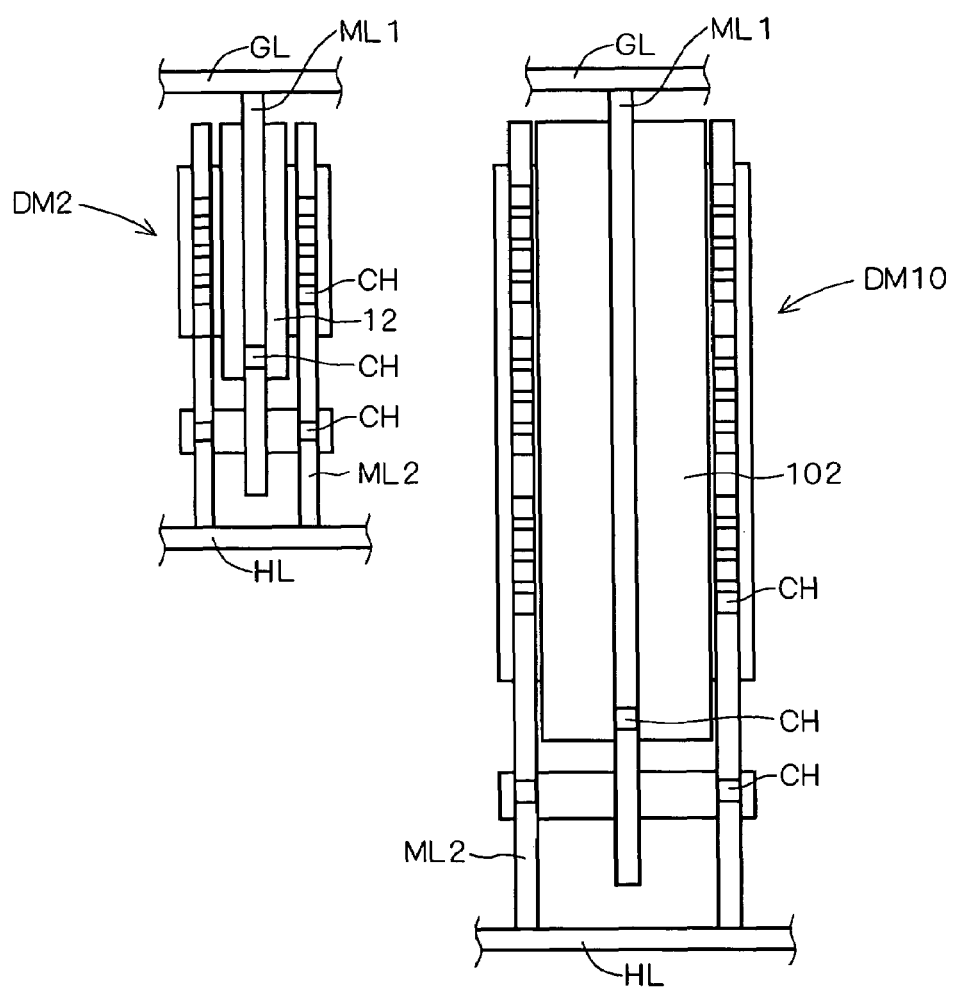
FIG. 9 is a plan view showing the decoupling capacitor which made gate length and gate width wide.

Decoupling capacitor DM2 and decoupling capacitor DM10 are shown in FIG. 9 as an example of the structure.

In FIG. 9, decoupling capacitor DM2 is the same as what was shown in FIG. 2 and FIG. 3, and decoupling capacitor DM10 has gate electrode 102 with bigger gate length and gate width than decoupling capacitor DM2.

Thus, area efficiency can be raised by enlarging gate length and gate width.

The structure of expanding gate width in decoupling capacitor DM2 in FIG. 9 in that area efficiency is raised while gate length has been narrow is also effective. In this case, although not reached in respect of area efficiency compared with decoupling capacitor DM10, since gate length is narrow, it is effective at the point of suppressing the voltage drop.

C. Effect

As explained above, in the embodiment concerning the present invention, the structure which uses together two kinds of decoupling capacitors DM1 and DM2 whose gate length differs in capacitor array HA for high-speed circuits is taken. Hereby, the voltage drop of a source line can be suppressed compared with the case where only decoupling capacitor DM1 is used. Decline in area efficiency can be suppressed compared with the case where only decoupling capacitor DM2 is used.

The same design rule as the gate electrode of a MOS transistor is applicable by making each gate electrode 12 and 22 of decoupling capacitors DM1 and DM2 into the same long and slender rectangular shape as the gate electrode of the MOS transistor. Since an arrangement design can not only become easy by this, but it can be manufactured on the same conditions as the manufacturing process of the MOS transistor, it has the advantage that it is not necessary to add alteration to the manufacturing process.

By using the MOS capacitor of an accumulation type as decoupling capacitors DM1 and DM2, the resistance of the body region becomes low rather than the case where an inversion type is used, and total resistance including on resistance can be reduced.

D. Modification 1

In decoupling capacitors DM1 and DM2 which form capacitor array HA for high-speed circuits in the embodiment explained above as shown in FIG. 2, the structure which includes P type impurity by concentration lower than a source/drain layer in each body region and in which there was no difference in both was explained. However, the following effects are acquired with forming with gate length's long decoupling capacitor and gate length's short decoupling capacitor so that it may distinguish between the impurity concentration of the body region.

Figure 10:
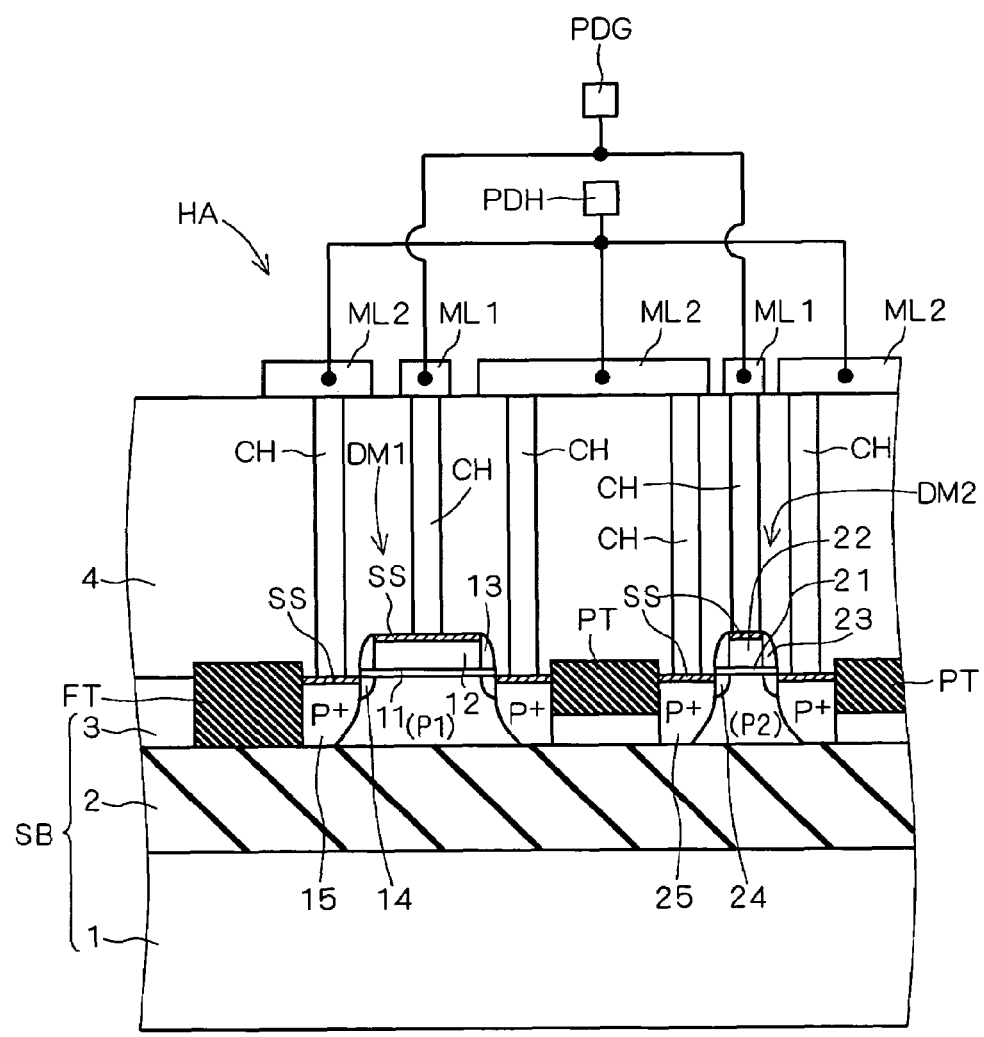
FIG. 10 is a sectional view showing the structure of Modification 1 of the semiconductor device of the embodiment concerning the present invention.

FIG. 10 is a sectional view showing the structure in which the impurity concentration of each body region differs in decoupling capacitors DM1 and DM2. About the same structure as the structure shown in FIG. 2, the same numerals are attached and the overlapping explanation is omitted.

In FIG. 10, the impurity concentration of the body region of decoupling capacitor DM1 is shown as P1, and the impurity concentration of the body region of decoupling capacitor DM2 is shown as P2. Impurity concentration P1 is set as the value lower than impurity concentration P2.

Although contact parts CH connected to gate electrode 12 and gate electrode 22 do not appear on the same sectional view as another contact parts, it is expressed with a solid line for convenience. Similarly, also in wiring ML1 and ML2, although there is a portion which does not appear on the same sectional view, it is expressed with a solid line for convenience.

Thus, the reliability of gate insulating film 11 of decoupling capacitor DM1 is maintainable by making low impurity concentration of the body region of gate length's long decoupling capacitor DM1.

That is, when the impurity concentration of a body region becomes high, the phenomenon in which the TDDB (dielectric breakdown with the passage of time: Time Dependent Dielectric Breakdown) characteristics of a gate insulating film decrease under the effect of an impurity will occur. The larger the area specified by the product of the gate length and gate width of the gate electrode is (i.e., the larger the area of the gate insulating film becomes) and the thicker the thickness becomes, the more remarkable this is. Therefore, the reliability of gate insulating film 11 is maintainable by making impurity concentration of a body region low in decoupling capacitor DM1.

Lowering of TDDB characteristics is generated not only when gate length is lengthened, but even when gate width, or both gate length and gate width are lengthened. Therefore, when taking the structure with a large area specified by the product of the gate length and gate width of the gate electrode, it is effective to make impurity concentration of a body region low.

On the other hand, in the MOS capacitor of an accumulation type, on resistance can be reduced by making impurity concentration of the body region high. Therefore, in decoupling capacitor DM2 with short gate length, total resistance including on resistance can be further reduced by making impurity concentration of the body region high. And it is effective in the ability to suppress the voltage drop of the source line further by reducing the resistance component.

As explained previously, decoupling capacitors DM1 and DM2 can be manufactured on the same conditions as the manufacturing process of a MOS transistor. Impurity introduction to a body region can be performed using the ion-implantation step of the impurity for threshold voltage setting of a MOS transistor. In this step, the ion implantation is performed dividing into a plurality of phases. Toward SOI layer 3 of the formation area of decoupling capacitor DM1, the ion implantation may be performed in not all phases, but the total amount of an injection rate is reduced by covering with a resist mask so that an ion implantation may not be performed.

On the contrary, what is necessary is just to implant in the formation area of a MOS transistor, to SOI layer 3 of the formation area of decoupling capacitor DM1, in the range which does not exceed the impurity concentration of a source/drain layer so that an equivalent amount of implantation may be performed or it may increase more than the formation area of a MOS transistor.

What is necessary is just to choose from the range of $1 \times 10^{12}$ to $6 \times 10^{18}$-/cm2 as implantation amount (dose amount) of the impurity to the body region of decoupling capacitors DM1 and DM2. In this range, the value from lower to higher than the impurity concentration of the body region of a MOS transistor is included.

With the point of maintaining the reliability of gate insulating film 11, not introducing an impurity into the body region of decoupling capacitor DM1 is also considered.

When not taking reduction of resistance into consideration, not introducing an impurity into the body region of decoupling capacitor DM2 will also be considered.

E. Modification 2

In the embodiment and modification 1 which were explained above, although decoupling capacitors DM1 and DM2 were explained as an MOS capacitor of an accumulation type, it is good also considering these as an MOS capacitor of an inversion type. In the MOS capacitor of an inversion type, the inversion layer where the conductivity type of the body region near the interface with the gate insulating film is reversed, and the carrier is concentrated is formed at the time of gate voltage application.

Figure 12:
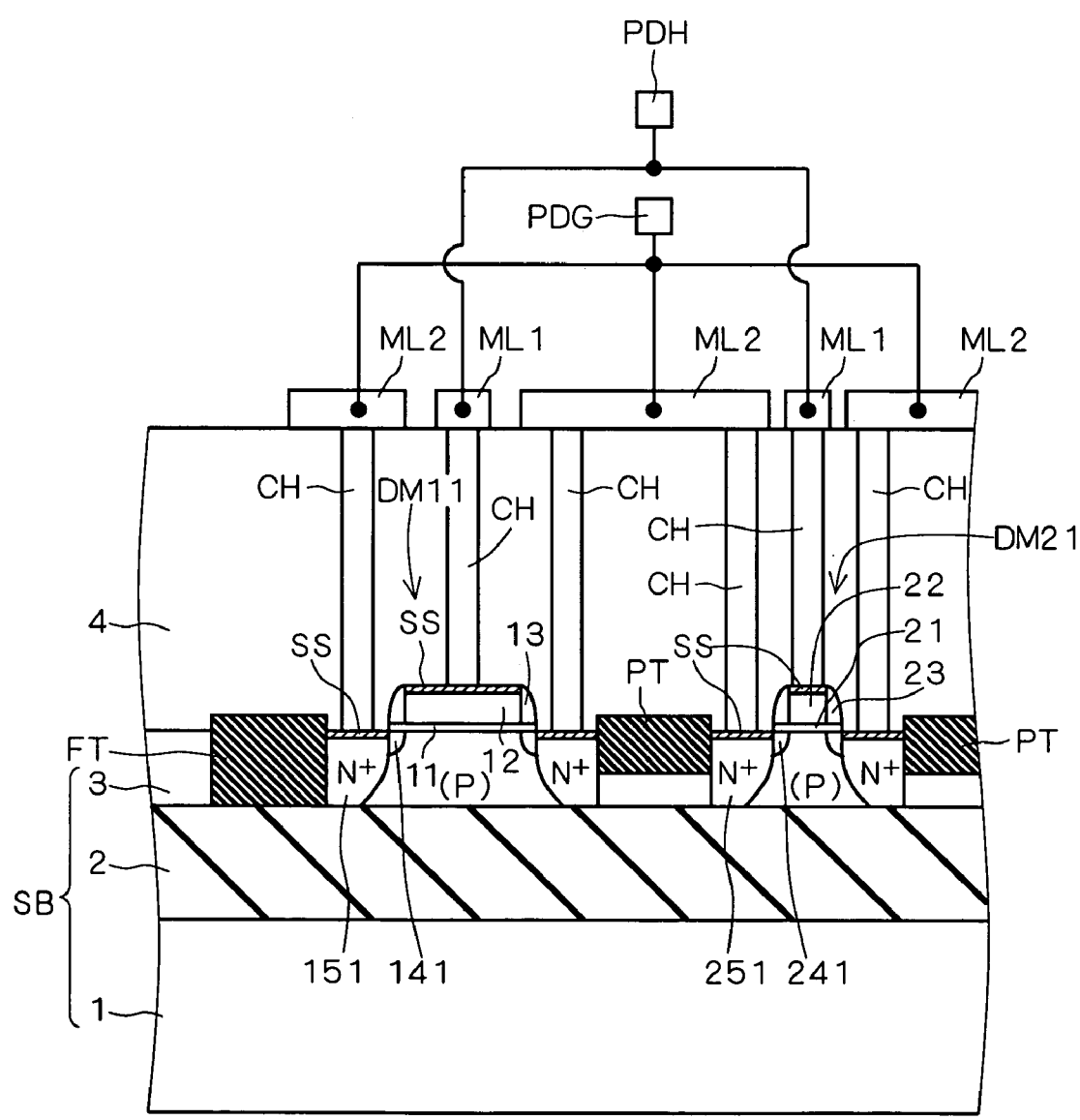
FIG. 12 is a sectional view showing the structure of Modification 2 of the semiconductor device of the embodiment concerning the present invention.

The arrangement at the time of forming decoupling capacitors DM11 and DM21 from an MOS capacitor of an inversion type is shown in FIG. 11, and the partially sectional view of capacitor array HA for high-speed circuits in the case is shown in FIG. 12.

In FIG. 11 and FIG. 12, about the same structure as FIG. 1 and FIG. 2, the same numerals are attached and the overlapping explanation is omitted.

As shown in FIG. 11, decoupling capacitors DM11 and DM21 are connected between source line HL connected to pad PDH for high-speed circuits which supplies electric power to circuit block C1, and ground line GL connected to ground pad PDG, and capacitor array HA for high-speed circuits is formed. A plurality of decoupling capacitor DM11 are connected between source line LL connected to pad PDL for low-speed circuits which supplies electric power to circuit block C2, and ground line GL connected to ground pad PDG, and capacitor array LA for low-speed circuits is formed. At these points, although they are the same as FIG. 1, decoupling capacitors DM11 and DM21 have the structure that the gate electrode is connected to source line HL by each, and a source drain electrode is connected to ground line GL.

As shown in FIG. 12, decoupling capacitor DM11 is provided with gate insulating film 11 selectively located on SOI layer 3, gate electrode 12 located on gate insulating film 11, and sidewall insulating layer 13 wrapping the side surface of gate electrode 12.

Source/drain layers 151 are located in the front surface of SOI layer 3 of the outside of sidewall insulating layer 13 of decoupling capacitor DM11, and extension layers 141 are located at the location shallower than source/drain layer 151.

Here, source/drain layer 151 is formed including N type impurity in high concentration (N$^+$) comparatively. The region (body region) of SOI layer 3 located between source/drain layers 151 includes the P type impurity by concentration lower than source/drain layer 151.

Decoupling capacitor DM21 is provided with gate insulating film 21 selectively located on SOI layer 3, gate electrode 22 located on gate insulating film 21, and sidewall insulating layer 23 which covers the side surface of gate electrode 22. And source/drain layers 251 are located in the front surface of SOI layer 3 of the outside of sidewall insulating layer 23. Extension layers 241 are located at the location shallower than source/drain layer 251.

Here, source/drain layer 251 is formed including N type impurity in high concentration (N$^+$) comparatively. The body region located between source/drain layers 251 includes the P type impurity by concentration lower than source/drain layer 151.

Although contact parts CH connected to gate electrode 12 and gate electrode 22 do not appear on the same sectional view as another contact parts, they are expressed with a solid line for convenience. Similarly, also in wiring ML1 and ML2, although there is a portion which does not appear on the same sectional view, it is expressed with a solid line for convenience.

Thus, also by forming decoupling capacitors DM11 and DM21 from an MOS capacitor of an inversion type, there is an effect which eases the electric field applied to gate insulating films 11 and 21, while getting the effect which suppresses the voltage drop of the source line, and the decline in area efficiency.

Namely, in the MOS capacitor of an inversion type, an inversion layer is formed in the body region near the interface with a gate insulating film at the time of gate voltage application. At this time, the electric potential of the inversion layer rises by threshold voltage, the electric potential difference between gate electrodes 12 and 22 and the body region becomes small by the threshold voltage, and the electric field applied to gate insulating films 11 and 21 is eased. By this, the reliability of gate insulating films 11 and 21 will improve.

F. Modification 3

In modification 2 explained above, improving the reliability of gate insulating films 11 and 21 was explained, forming decoupling capacitors DM11 and DM21 from an MOS capacitor of an inversion type. However, the reliability of gate insulating films 11 and 21 can be more surely improved by adopting the first-the fifth structures explained below. Although the example of application to capacitor array HA for high-speed circuits is shown below, it is needless to say that it may apply to capacitor array LA for low-speed circuits.

F-1. First Structure for Electric Field Relaxation

Figure 13:
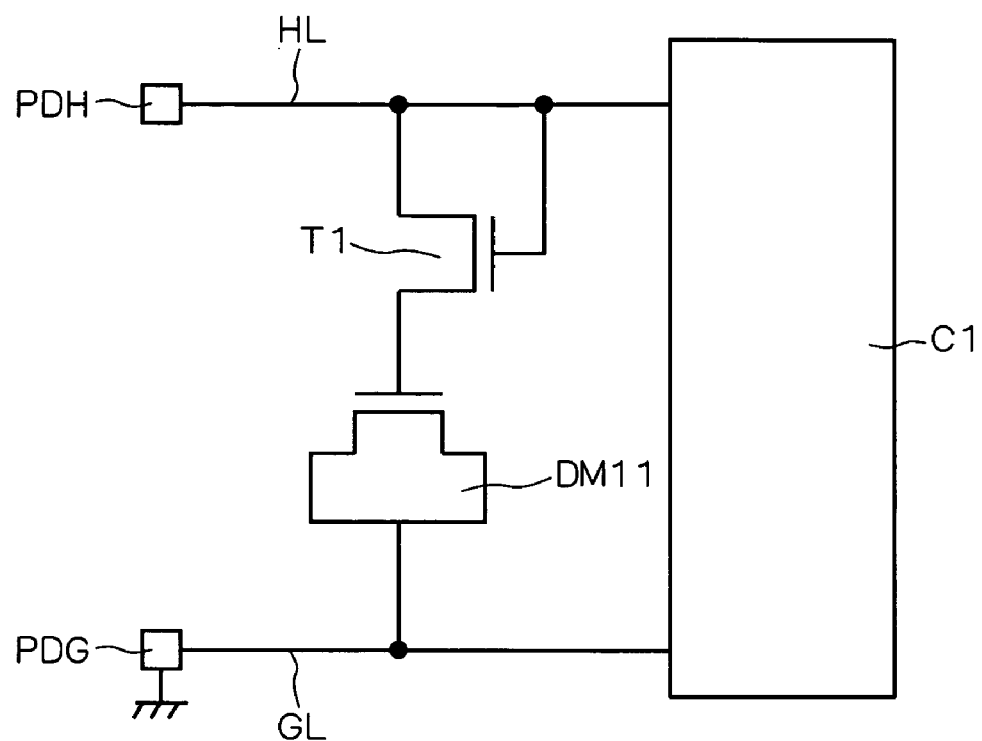
FIG. 13 is a circuit diagram showing the first structure of Modification 3 of the semiconductor device of the embodiment concerning the present invention.
Figure 14:
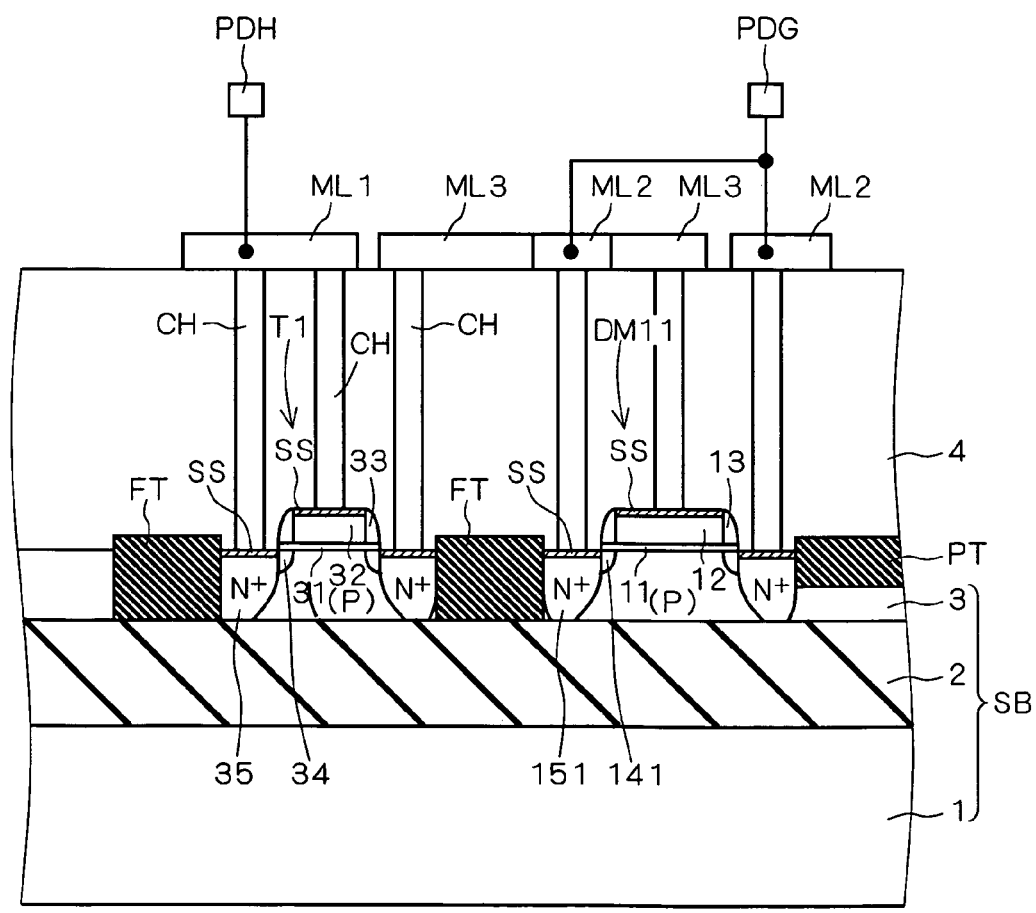
FIG. 14 is a sectional view showing the first structure of Modification 3 of the semiconductor device of the embodiment concerning the present invention.

The first structure for electric field relaxation is explained using FIG. 13 and FIG. 14. As shown in FIG. 13, in the first structure for electric field relaxation, N channel type MOS transistor T1 is connected to the gate electrode side of decoupling capacitor DM11 located between source line HL connected to pad PDH for high-speed circuits, and ground line GL connected to ground pad PDG.

The gate electrode of MOS transistor T1 is connected to source line HL, and MOS transistor T1 functions as a forward-direction diode or resistance. And the source electrode of MOS transistor T1 is connected to the gate electrode of decoupling capacitor DM11.

FIG. 14 is a drawing showing the first structure for electric field relaxation shown in FIG. 13 as an element sectional view. About the same structure as the structure shown in FIG. 12, the same numerals are attached and the overlapping explanation is omitted.

As shown in FIG. 14, MOS transistor T1 is provided with gate insulating film 31 selectively located on SOI layer 3, gate electrode 32 located on gate insulating film 31, and sidewall insulating layer 33 which covers the side surface of gate electrode 32.

Source/drain layers 35 are located in the front surface of SOI layer 3 of the outside of sidewall insulating layer 33. Extension layers 34 are located at the location shallower than source/drain layer 35.

Source/drain layer 35 is formed, including N type impurity in high concentration (N$^+$) comparatively. The region (body region) of SOI layer 3 located between source/drain layers 35 includes the P type impurity by concentration lower than source/drain layer 35.

And silicide film SS is located at source/drain layer 35 upper part and the upper surface of gate electrode 32.

Since MOS transistor T1 and decoupling capacitor DM11 are electrically thoroughly separated by full trench isolation insulating layer FT, even if both arrangement interval is shortened, it can be prevented that junction leakage current flows. Therefore, compared with the case where a bulk silicon substrate is used, an integration degree can be raised by using a SOI substrate.

In forming MOS transistor T1 and decoupling capacitor DM11 in a bulk silicon substrate, in order to reduce above-mentioned junction leakage current, impurity concentration in each body region must be made low. However, when forming in a SOI substrate, such consideration will be unnecessary and the resistance of a body region can be made low.

In FIG. 14, partial trench isolation insulating layer PT is formed in portions other than between MOS transistor T1 and decoupling capacitor DM11.

Partial trench isolation insulating layer PT forms a trench in the front surface of an SOI layer so that SOI layer 3 of prescribed thickness may remain between the bottom of a trench, and buried oxide film 2, and it is formed by embedding an insulating material in this trench. Movement of a carrier is possible through the well region of the lower part of a trench isolation insulating layer, it can be prevented that a carrier remains in the channel formation area, and the electric potential of the body region can be fixed through the well region.

Interlayer insulation film 4 which comprises, for example a silicon oxide layer is located so that the SOI substrate SB upper part whole region may be covered. A plurality of contact parts CH are formed so that they may connect with gate electrodes 32 and 12 and source/drain layers 35 and 151, penetrating interlayer insulation film 4.

And the side which serves as a drain layer between source/drain layers 35 of MOS transistor T1, and gate electrode 32 are connected to wiring ML1 via contact part CH. Source/drain layer 151 of decoupling capacitor DM11 is connected to wiring ML2 via contact part CH.

The side which serves as a source layer between source/drain layers 35 of MOS transistor T1, and gate electrode 12 of decoupling capacitor DM11 are connected to wiring ML3 via contact part CH.

And wiring ML1 is electrically connected to pad PDH for high-speed circuits, and wiring ML2 is electrically connected to ground pad PDG.

Although contact parts CH connected to gate electrode 32 and gate electrode 12 do not appear on the same sectional view as another contact parts, they are expressed with a solid line for convenience. Similarly, also in wirings ML1-ML3, although there is a portion which does not appear on the same sectional view, it is expressed with a solid line for convenience.

By taking the structure explained above, the electric potential difference between gate electrode 12 and the body region of decoupling capacitor DM11 becomes small by the voltage drop by the on resistance of MOS transistor T1, and the electric field applied to gate insulating film 11 will be eased. By this, the reliability of gate insulating film 11 will improve.

Although the above explanation showed the example which connected MOS transistor T1 only to decoupling capacitor DM11, it is needless to say that it may connect with decoupling capacitor DM21 (FIG. 12) used together.

MOS transistor T1 may be connected to decoupling capacitors DM1 and DM2 (FIG. 2) which comprise an MOS capacitor of an accumulation type.

F-2. Second Structure for Electric Field Relaxation

Figure 15:
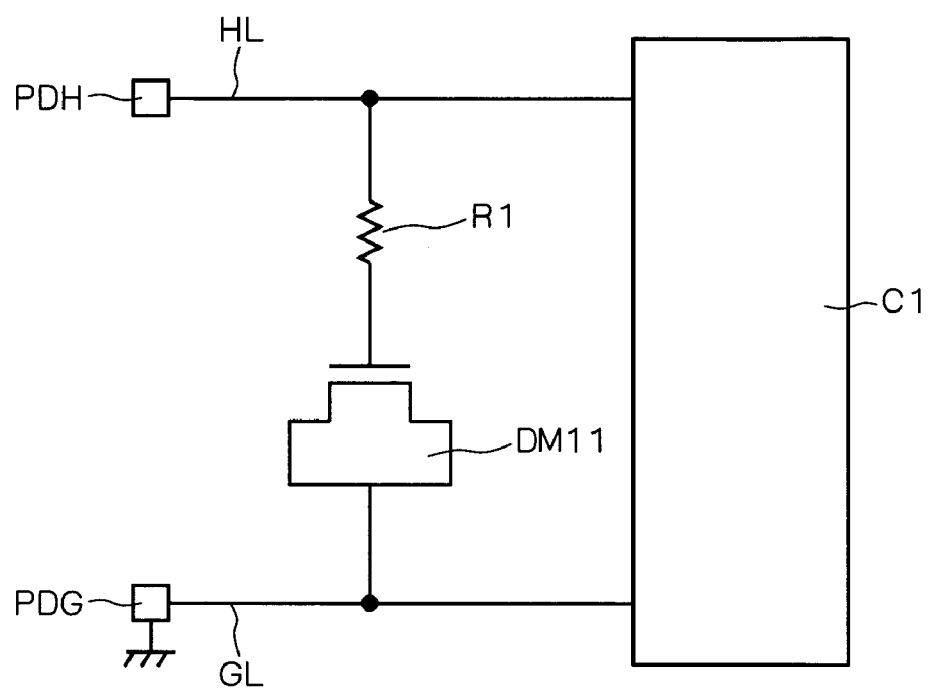
FIG. 15 is a circuit diagram showing the second structure of Modification 3 of the semiconductor device of the embodiment concerning the present invention.
Figure 16:
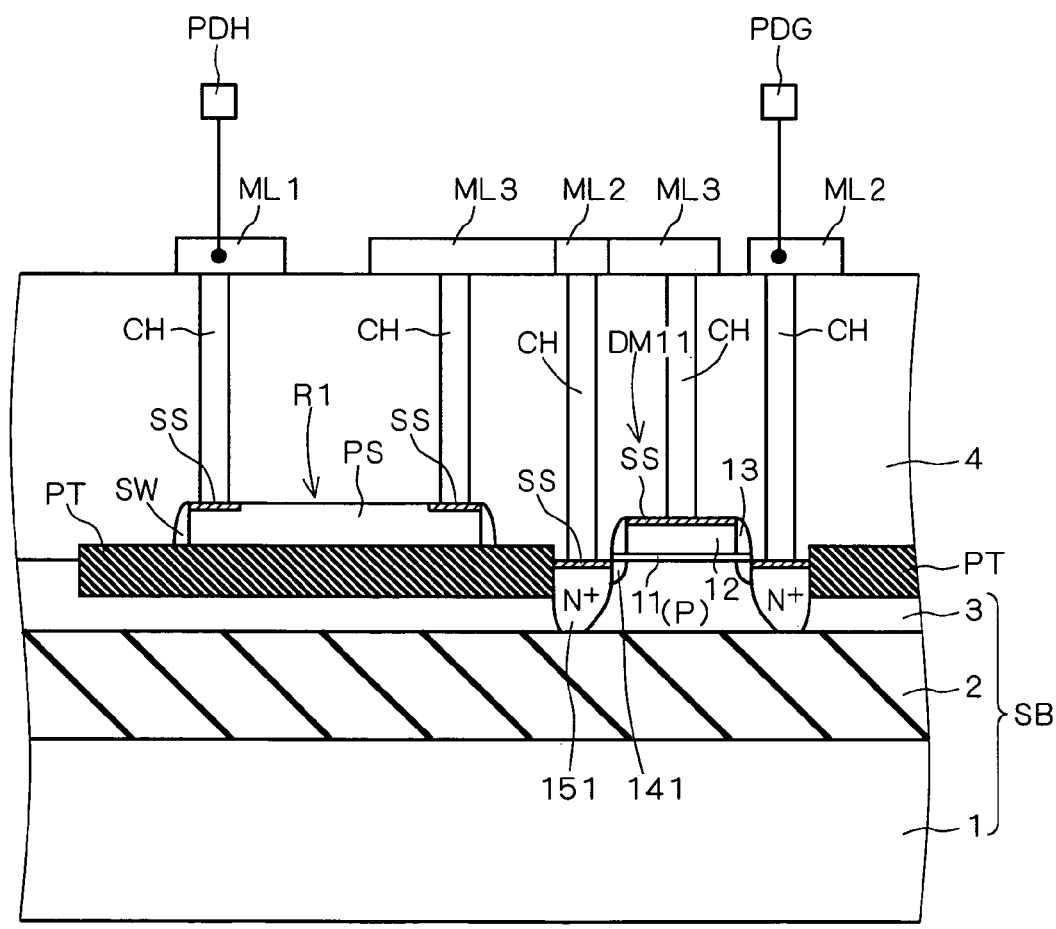
FIG. 16 is a sectional view showing the second structure of Modification 3 of the semiconductor device of the embodiment concerning the present invention.

The second structure for electric field relaxation is explained using FIG. 15 and FIG. 16. As shown in FIG. 15, in the second structure for electric field relaxation, resistance R1 is connected to the gate electrode side of decoupling capacitor DM11 located between source line HL connected to pad PDH for high-speed circuits, and ground line GL connected to ground pad PDG.

FIG. 16 is a drawing showing the second structure for the electric field relaxation shown in FIG. 15 as an element sectional view. About the same structure as the structure shown in FIG. 12, the same numerals are attached and the overlapping explanation is omitted.

As shown in FIG. 16, resistance R1 comprises polysilicon film PS located on partial trench isolation insulating layer PT located in the front surface of SOI layer 3. Polysilicon film PS can be simultaneously formed at the time of formation of the gate electrode of decoupling capacitor DM11. And silicide film SS is located at the portions used as the both ends of resistance R1.

Interlayer insulation film 4 which comprises, for example a silicon oxide layer is located so that the SOI substrate SB upper part whole region may be covered. A plurality of contact parts CH are formed so that they may connect with polysilicon film PS, gate electrode 12, and source/drain layer 151, penetrating interlayer insulation film 4.

And the portion of the one side end of polysilicon film PS in which silicide film SS was formed is connected to wiring ML1 via contact part CH. Source/drain layer 151 of decoupling capacitor DM11 is connected to wiring ML2 via contact part CH.

The portion of the another side end of polysilicon film PS in which silicide film SS was formed, and gate electrode 12 of decoupling capacitor DM11 are connected to wiring ML3 via contact parts CH.

And wiring ML1 is electrically connected to pad PDH for high-speed circuits, and wiring ML2 is electrically connected to ground pad PDG.

Although contact part CH connected to gate electrode 12 does not appear on the same sectional view as another contact parts, it is expressed with a solid line for convenience. Similarly, also in wirings ML1-ML3, although there is a portion which does not appear on the same sectional view, it is expressed with a solid line for convenience.

By taking the structure explained above, the electric potential difference between gate electrode 12 and the body region of decoupling capacitor DM11 becomes small by the voltage drop by resistance R1, and the electric field applied to gate insulating film 11 will be eased. By this, the reliability of gate insulating film 11 will improve.

Although the above explanation showed the example which connected resistance R1 only to decoupling capacitor DM11, it is needless to say that it may connect with decoupling capacitor DM21 (FIG. 9) used together.

Resistance R1 may be connected to decoupling capacitors DM1 and DM2 (FIG. 2) which comprise an MOS capacitor of an accumulation type.

F-3. Third Structure for Electric Field Relaxation

Figure 17:
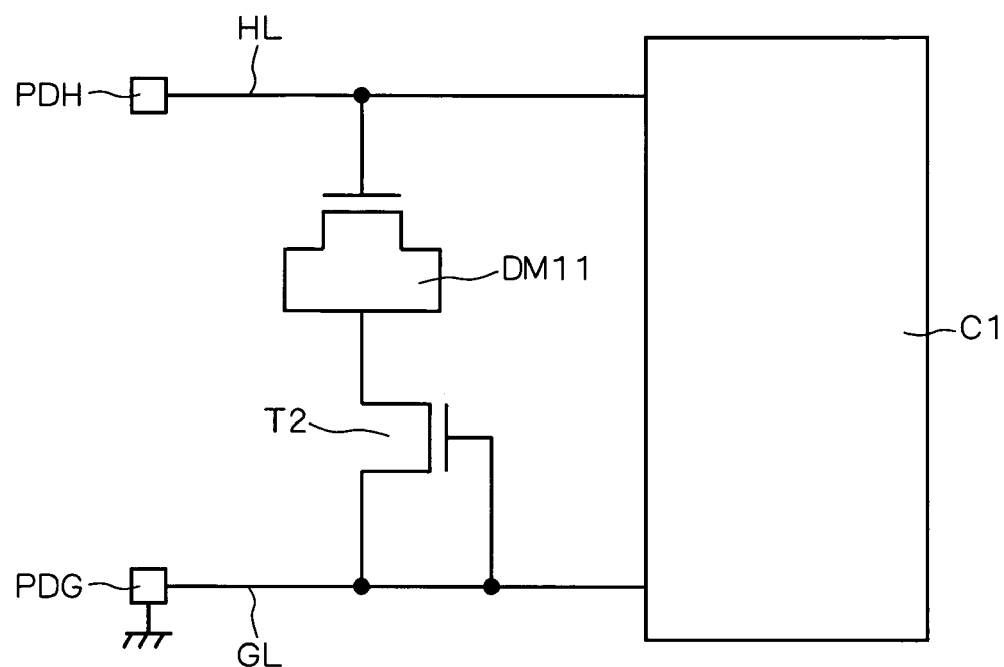
FIG. 17 is a circuit diagram showing the third structure of Modification 3 of the semiconductor device of the embodiment concerning the present invention.

The third structure for electric field relaxation is explained using FIG. 17 and FIG. 18. As shown in FIG. 17, in the third structure for electric field relaxation, MOS transistor T2 is connected to the source drain electrode side of decoupling capacitor DM11 located between source line HL connected to pad PDH for high-speed circuits, and ground line GL connected to ground pad PDG.

The gate electrode of MOS transistor T2 is connected to ground line GL, and MOS transistor T2 functions as resistance, when the gate is 0V. And the source electrode of MOS transistor T2 is connected to the source drain electrode of decoupling capacitor DM11.

FIG. 18 is a drawing showing the third structure for electric field relaxation shown in FIG. 17 as an element sectional view.

Since the structure of decoupling capacitor DM11 is fundamentally the same as what was explained using FIG. 12 as shown in FIG. 18, the overlapping explanation is omitted.

MOS transistor T2 is provided with gate insulating film 41 selectively located on SOI layer 3, gate electrode 42 located on gate insulating film 41, and sidewall insulating layer 43 which covers the side surface of gate electrode 42.

Source/drain layers 45 are located in the front surface of SOI layer 3 of the outside of sidewall insulating layer 43. Extension layers 44 are located at the location shallower than source/drain layer 45. And silicide film SS is located at source/drain layer 45 upper part and the upper surface of gate electrode 42.

Source/drain layer 45 is formed, including N type impurity in high concentration ($N^+$) comparatively. The region (body region) of SOI layer 3 located between source/drain layers 45 includes the N type impurity by concentration lower than source/drain layer 45. The source/drain layer of each one side of decoupling capacitor DM11 and MOS transistor T2 is used as a common source/drain layer. In FIG. 18, the source/drain layer arranged between both is expressed as common source/drain layer 45 (151).

Interlayer insulation film 4 which comprises, for example a silicon oxide layer is located so that the SOI substrate SB upper part whole region may be covered. A plurality of contact parts CH are formed so that they may connect with gate electrodes 12 and 42 and source/drain layers 151 and 45, penetrating interlayer insulation film 4.

And gate electrode 12 of decoupling capacitor DM11 is connected to wiring ML1 via contact part CH. Moreover, one of two source/drain layers 45 of MOS transistor T2 and gate electrode 42 are connected to wiring ML2 via contact parts CH. Source/drain layers 151 of decoupling capacitor DM11 and source/drain layer 45 of another side of MOS transistor T2 are connected to wiring ML3 via contact parts CH.

And wiring ML1 is electrically connected to pad PDH for high-speed circuits, and wiring ML2 is electrically connected to ground pad PDG.

Although contact parts CH connected to gate electrode 12 and gate electrode 42 do not appear on the same sectional view as another contact parts, they are drawn with a solid line for convenience. Similarly, also in wirings ML1-ML3, although there is a portion which does not appear on the same sectional view, it is expressed with a solid line for convenience.

By taking the structure explained above, the electric potential difference between gate electrode 12 and the body region of decoupling capacitor DM11 becomes small by the voltage drop by resistance in the N+-N-N+ layer of MOS transistor T2, and the electric field applied to gate insulating film 11 is eased. By this, the reliability of gate insulating film 11 will improve.

Although the above explanation showed the example which connected MOS transistor T2 only to decoupling capacitor DM11, it is needless to say that it may be connected to decoupling capacitor DM21 (FIG. 12) used together.

MOS transistor T2 may be connected to decoupling capacitors DM1 and DM2 (FIG. 2) which comprise an MOS capacitor of an accumulation type.

F-4. Fourth Structure for Electric Field Relaxation

Figure 19:
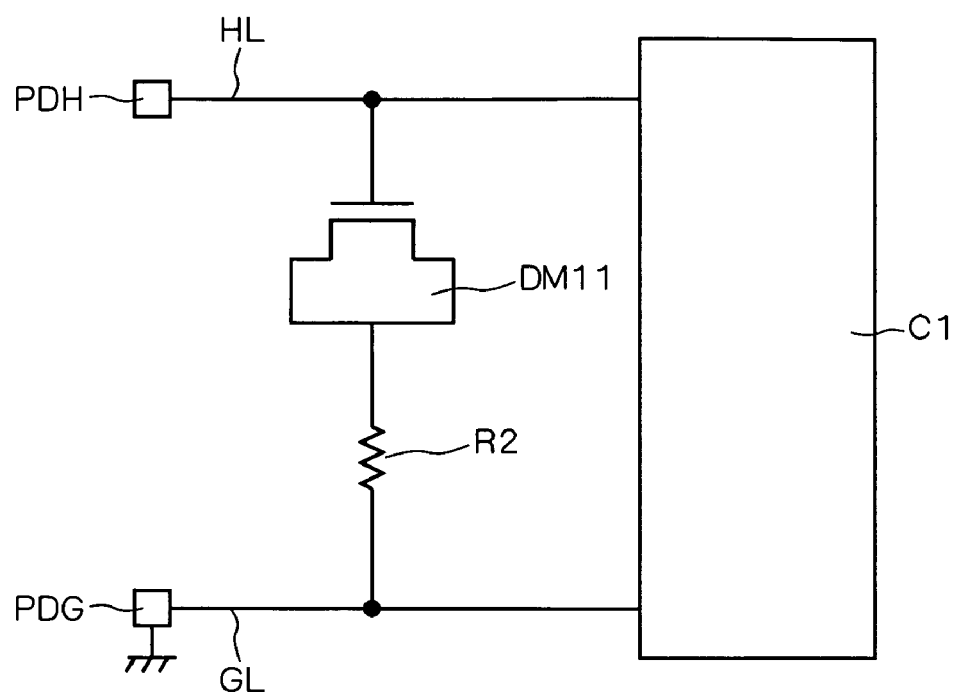
FIG. 19 is a circuit diagram showing the fourth structure of Modification 3 of the semiconductor device of the embodiment concerning the present invention.
Figure 20:
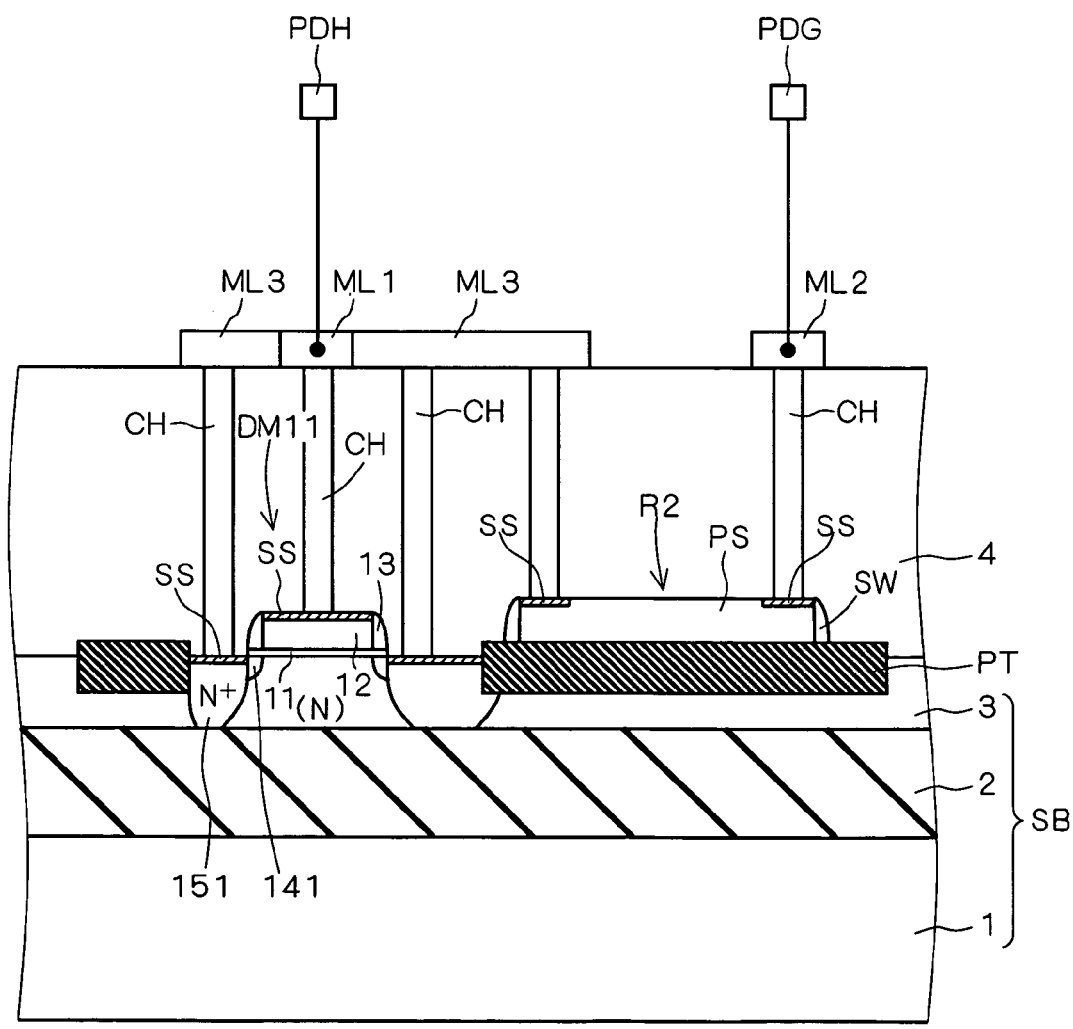
FIG. 20 is a sectional view showing the fourth structure of Modification 3 of the semiconductor device of the embodiment concerning the present invention.

The fourth structure for electric field relaxation is explained using FIG. 19 and FIG. 20. As shown in FIG. 19, in the fourth structure for electric field relaxation, resistance R2 is connected to the source drain electrode side of decoupling capacitor DM11 located between source line HL connected to pad PDH for high-speed circuits, and ground line GL connected to ground pad PDG.

FIG. 20 is a drawing showing the fourth structure for the electric field relaxation shown in FIG. 19 as an element sectional view. About the same structure as the structure shown in FIG. 12, the same numerals are attached and the overlapping explanation is omitted.

As shown in FIG. 20, resistance R2 comprises polysilicon film PS located on partial trench isolation insulating layer PT located in the front surface of SOI layer 3. Polysilicon film PS can be simultaneously formed at the time of formation of the gate electrode of decoupling capacitor DM11. And silicide film SS is located at the portion used as the both ends of resistance R2.

Interlayer insulation film 4 which comprises, for example a silicon oxide layer is located so that the SOI substrate SB upper part whole region may be covered. A plurality of contact parts CH are formed so that they may connect with polysilicon film PS, gate electrode 12, and source/drain layer 151, penetrating interlayer insulation film 4.

And gate electrode 12 of decoupling capacitor DM11 is connected to wiring ML1 via contact part CH. Source/drain layer 151 of decoupling capacitor DM11, and the portion in which silicide film SS was formed of the one side end of polysilicon film PS are connected to wiring ML3 via contact part CH.

The portion in which silicide film SS was formed of the another side end of polysilicon film PS is connected to wiring ML2 via contact part CH.

And wiring ML1 is electrically connected to pad PDH for high-speed circuits, and wiring ML2 is electrically connected to ground pad PDG.

Although contact part CH connected to gate electrode 12 does not appear on the same sectional view as another contact parts, it is expressed with a solid line for convenience. Similarly, also in wirings ML1-ML3, although there is a portion which does not appear on the same sectional view, it is drawn with a solid line for convenience.

By taking the structure explained above, the electric potential difference between gate electrode 12 and the body region of decoupling capacitor DM11 becomes small by the voltage drop by resistance R2, and the electric field applied to gate insulating film 11 is eased. By this, the reliability of gate insulating film 11 will improve.

Although the above explanation showed the example which connected resistance R2 only to decoupling capacitor DM11, it is needless to say that it may be connected to decoupling capacitor DM21 (FIG. 12) used together.

Resistance R2 may be connected to decoupling capacitors DM1 and DM2 (FIG. 2) which comprise an MOS capacitor of an accumulation type.

F-5. Fifth Structure for Electric Field Relaxation

Figure 21:
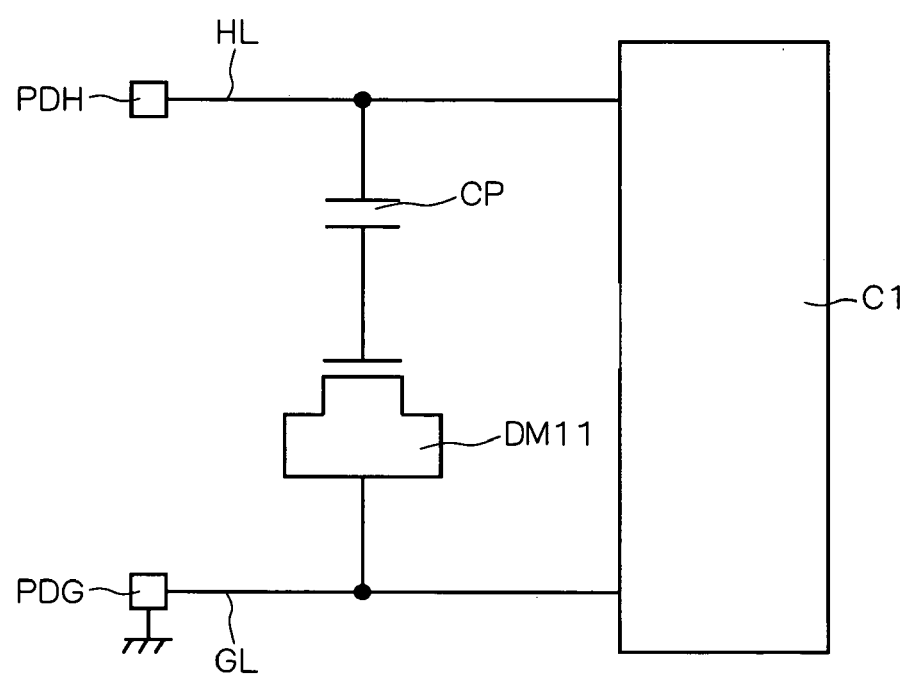
FIG. 21 is a circuit diagram showing the fifth structure of Modification 3 of the semiconductor device of the embodiment concerning the present invention.
Figure 22:
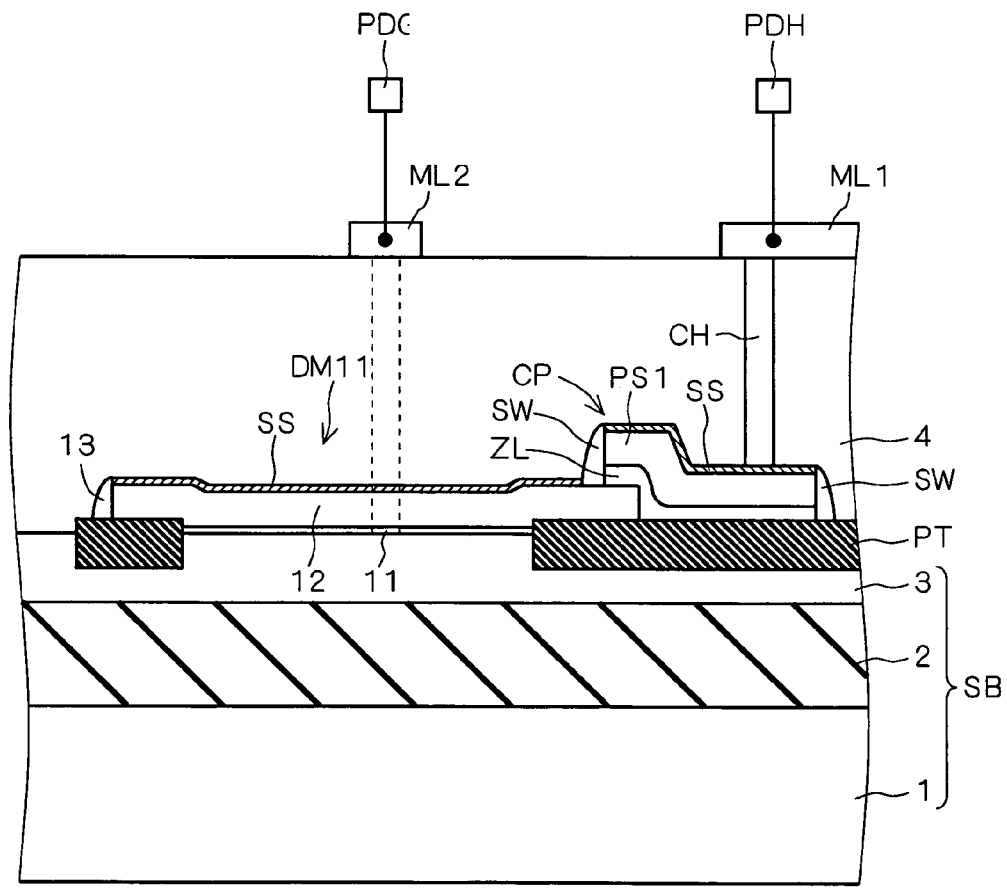
FIG. 22 is a sectional view showing the fifth structure of Modification 3 of the semiconductor device of the embodiment concerning the present invention.

The fifth structure for electric field relaxation is explained using FIG. 21 and FIG. 22. As shown in FIG. 21, in the fifth structure for electric field relaxation, capacitor CP is connected to the gate electrode side of decoupling capacitor DM11 located between source line HL connected to pad PDH for high-speed circuits, and ground line GL connected to ground pad PDG.

FIG. 22 is a drawing showing the fifth structure for the electric field relaxation shown in FIG. 21 as an element sectional view. FIG. 22 is a sectional view along the gate width direction of gate electrode 11 of decoupling capacitor DM11 shown in FIG. 12. About the same structure as FIG. 12, the same numerals are attached and the overlapping explanation is omitted.

As shown in FIG. 22, in gate electrode 12 of decoupling capacitor DM11, silicide film SS is not formed in one end portion of a gate width direction, but it is covered with insulating layer ZL formed by a silicon oxide layer etc. Insulating layer ZL is formed, crossing to the upper part of partial trench isolation insulating layer PT from on above-mentioned one end portion. The thickness of this insulating layer ZL is determined in consideration of the capacity of decoupling capacitor DM11.

And polysilicon film PS1 is located at the upper part of insulating layer ZL, and silicide film SS is formed on polysilicon film PS1. Although sidewall insulating layer SW is formed at the side surface of polysilicon film PS1, this is formed at the same step as formation of sidewall insulating layer 13 of decoupling capacitor DM11.

Polysilicon film PS1 is connected to wiring ML1 by contact part CH formed by penetrating interlayer insulation film 4 covering SOI substrate SB upper part. Wiring ML1 is electrically connected to pad PDH for high-speed circuits.

Figure 23:
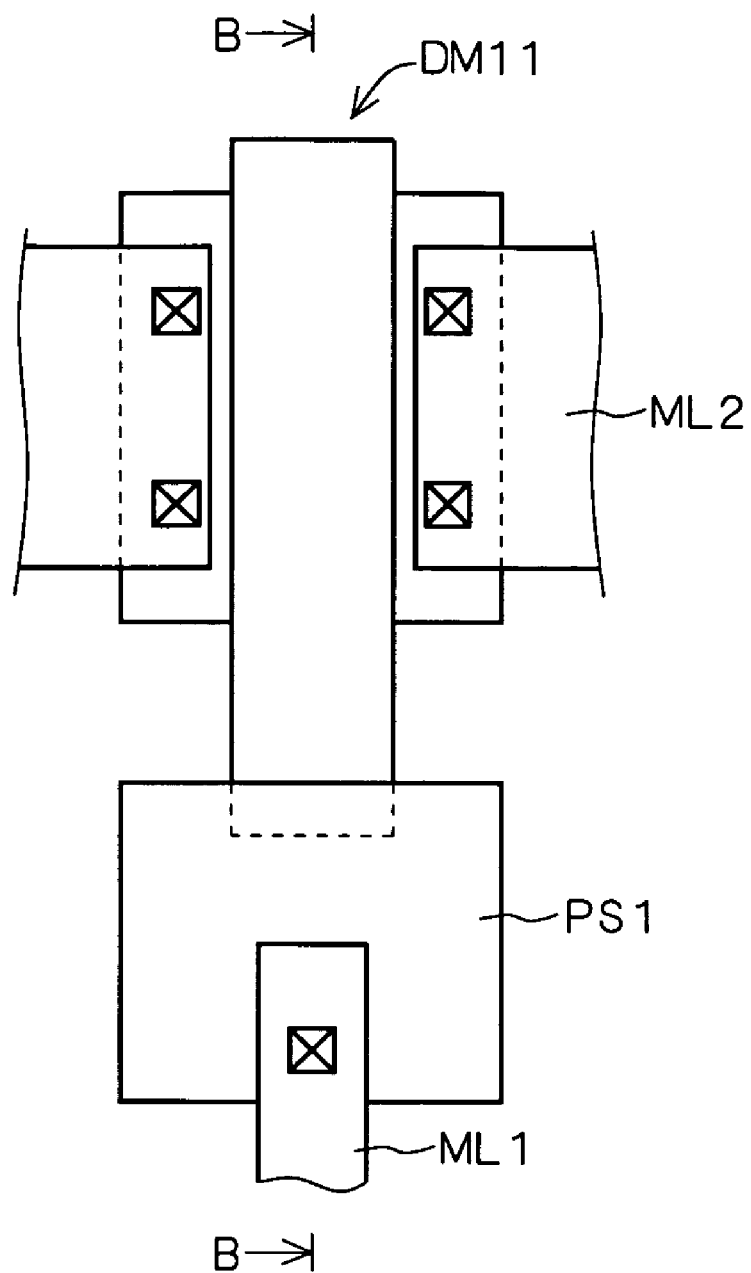
FIG. 23 is a plan view showing the fifth structure of Modification 3 of the semiconductor device of the embodiment concerning the present invention.

FIG. 23 is a plan view showing the shape at the time of seeing decoupling capacitor DM11 and capacitor CP from the gate electrode upper part. The arrow direction cross section in the B-B line in FIG. 23 is equivalent to FIG. 22.

By taking the structure explained above, capacitor CP which makes insulating layer ZL a capacitor insulating layer is connected to gate electrode 12 of decoupling capacitor DM11 in series. By connecting capacitor CP with decoupling capacitor DM11 in series, the electric potential between source line HL and ground line GL is divided, the electric potential difference between gate electrode 12 and the body region of decoupling capacitor DM11 becomes small, and the electric field applied to gate insulating film 11 is eased. By this, the reliability of gate insulating film 11 will improve.

Since insulating layer ZL which covers gate electrode 12 forms a capacitor insulating layer and gate electrode 12 is used as an electrode of the capacitor, the capacitor can be arranged efficiently.

G. Modification 4

In the embodiment explained above and its modifications 1-3, although explained as what uses any of an inversion type or an accumulation type as a decoupling capacitor, both may be connected to one source line.

Figure 24:
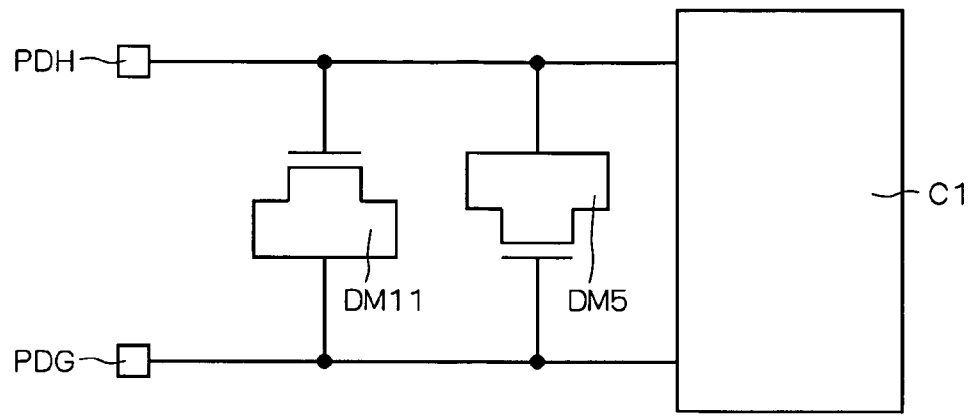
FIG. 24 is a circuit diagram showing the structure of Modification 4 of the semiconductor device of the embodiment concerning the present invention.

The structure where decoupling capacitor DM11 of an inversion type and decoupling capacitor DM5 of an accumulation type are located in parallel between source line HL connected to pad PDH for high-speed circuits and ground line GL connected to ground pad PDG is shown in FIG. 24.

Figure 25:
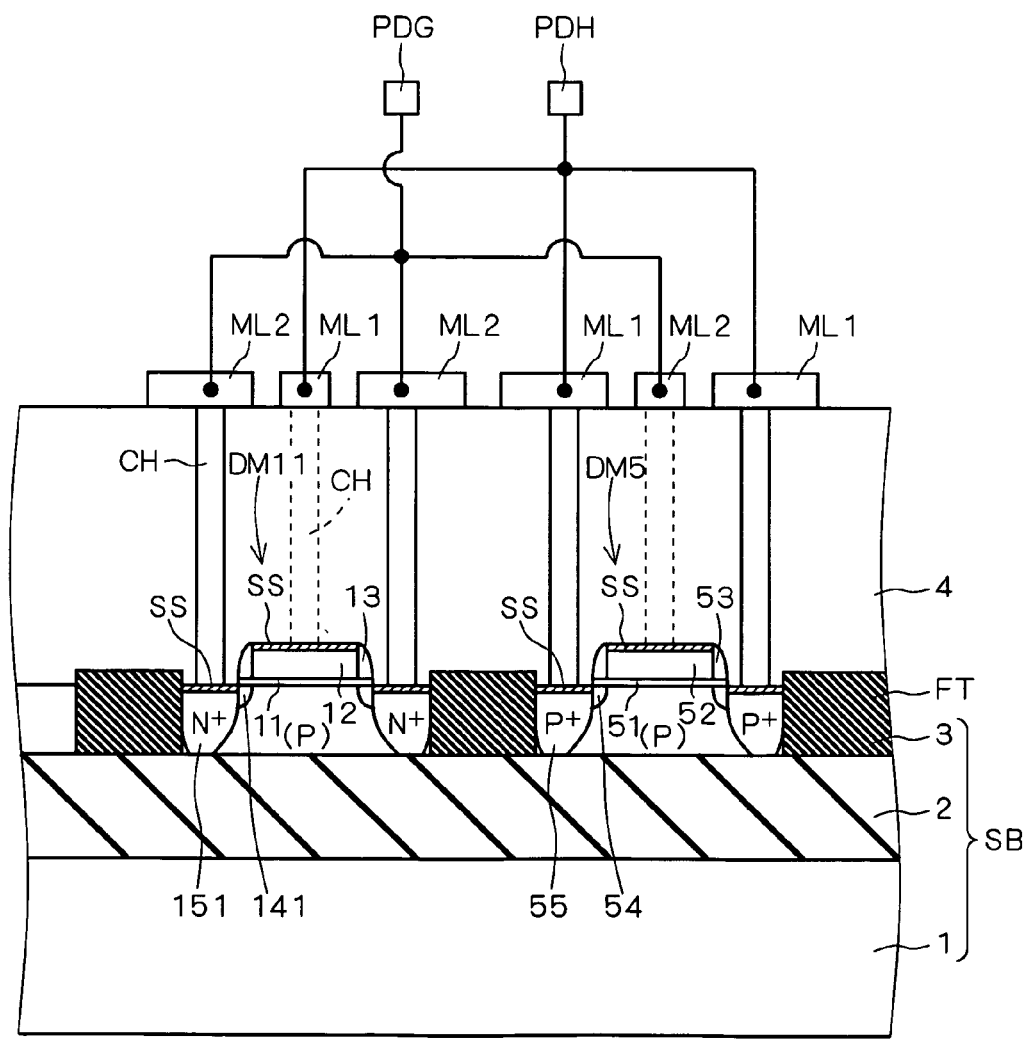
FIG. 25 is a sectional view showing the structure of Modification 4 of the semiconductor device of the embodiment concerning the present invention.

The structure shown in FIG. 24 is shown in FIG. 25 as an element sectional view. In FIG. 25, about the same structure as the structure shown in FIG. 12, the same numerals are attached and the overlapping explanation is omitted. Decoupling capacitor DM5 is provided with gate insulating film 51 selectively located on SOI layer 3, gate electrode 52 located on gate insulating film 51, and sidewall insulating layer 53 which covers the side surface of gate electrode 52 in FIG. 25.

Source/drain layer 55 is located in the front surface of SOI layer 3 of the outside of sidewall insulating layer 53 of decoupling capacitor DM5. Extension layer 54 is located at the location shallower than source/drain layer 55.

Here, source/drain layer 55 is formed, including P type impurity in high concentration (P$^+$) comparatively. The region (body region) of SOI layer 3 located between source/drain layers 55 includes P type impurity by concentration lower than source/drain layer 55.

Interlayer insulation film 4 which comprises, for example a silicon oxide layer is located so that the SOI substrate SB upper part whole region may be covered. A plurality of contact parts CH are formed so that they may connect with gate electrodes 12 and 52 and source/drain layers 151 and 55, penetrating interlayer insulation film 4.

And gate electrode 12 of decoupling capacitor DM11 and source/drain layer 55 of decoupling capacitor DM5 are connected to wiring ML1 via contact part CH.

Gate electrode 52 of decoupling capacitor DM5 and source/drain layer 151 of decoupling capacitor DM11 are connected to wiring ML2 via contact part CH.

And wiring ML1 is electrically connected to pad PDH for high-speed circuits, and wiring ML2 is electrically connected to ground pad PDG.

In FIG. 24 and FIG. 25, the structure where source/drain layer 151 is an N type and the body region is a P type was shown as decoupling capacitor DM11 of an inversion type. However, the structure where the source/drain layer is a P type and the body region is an N type is also possible. In this case, like decoupling capacitor DM5, the gate electrode can be connected to ground pad PDG, and the source/drain layer can be connected to pad PDH for high-speed circuits.

As decoupling capacitor DM5 of an accumulation type, the structure where source/drain layer 55 is a P type and the body region is a P type was shown conversely. However, the structure where the source/drain layer is an N type and the body region is an N type is also possible. In this case, like decoupling capacitor DM11, the gate electrode can be connected to pad PDH for high-speed circuits, and the source/drain layer can be connected to ground pad PDG.

H. Modification 5

In the embodiment and its modifications 1-4 which were explained above, to connect a decoupling capacitor between source line HL and ground line GL was considered as an fundamental structure, and the structure which always stabilizes the voltage of source line HL by a decoupling capacitor was adopted. However, it is also good to adopt the structure where voltage is not applied to the decoupling capacitor while the element circuit located in the circuit block is not operating.

Figure 26:
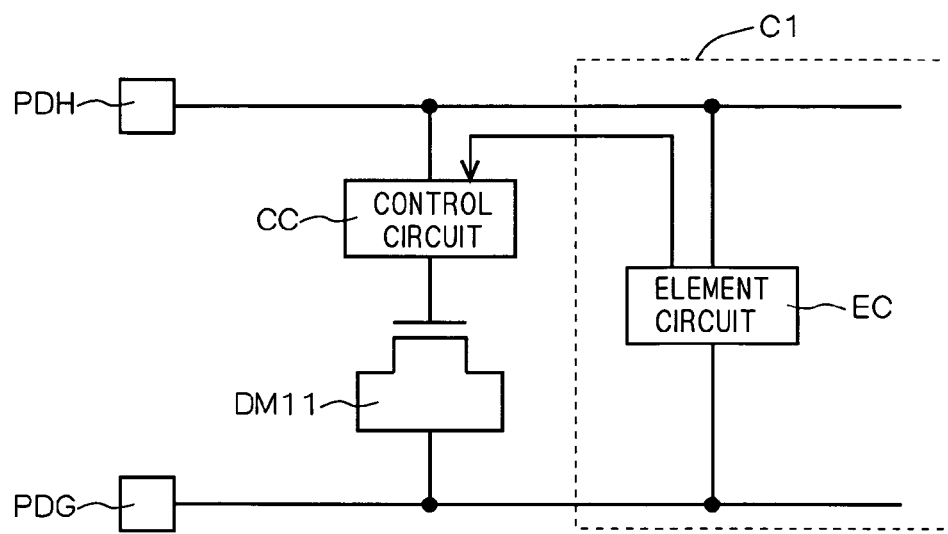
FIG. 26 is a circuit diagram showing the structure of Modification 5 of the semiconductor device of the embodiment concerning the present invention.

The structure for that is shown in FIG. 26. As shown in FIG. 26, control-circuit CC is located at the gate electrode side of decoupling capacitor DM11 located between source line HL and ground line GL.

Control-circuit CC is inserted during the wiring which connects source line HL, and the gate electrode of decoupling capacitor DM11, and has the structure of receiving the signal showing whether the element circuit EC concerned is operating from element circuit EC included in circuit block C1.

When element circuit EC is not operating, or when it is in a standby state, control-circuit CC is formed so that the voltage of source line HL may not be applied to decoupling capacitor DM11. Control-circuit CC is formed so that the voltage of source line HL may be applied in element circuit EC operating.

It has the function that connection between source line HL and decoupling capacitor DM11 is cut, and decoupling capacitor DM11 is made into floating, or the gate electrode of decoupling capacitor DM11 is connected to grounding electric potential compulsorily, when element circuit EC is not operating, for example.

By having such control-circuit CC, the state where the electric field is always added to the gate electrode of decoupling capacitor DM11 is canceled, and the reliability of the gate electrode can be maintained.

I. Modification 6

The example of the plane structure of capacitor array HA for high-speed circuits and capacitor array LA for low-speed circuits was explained using FIG. 3. Area efficiency can be improved by using the structure including one or more decoupling capacitors of the same kind as a primitive cell, and setting up, as to this primitive cell, so that the size specified with the dimension of a gate width direction and the dimension of the direction of gate length may become common irrelevant to the kind of included decoupling capacitor.

Figure 27:
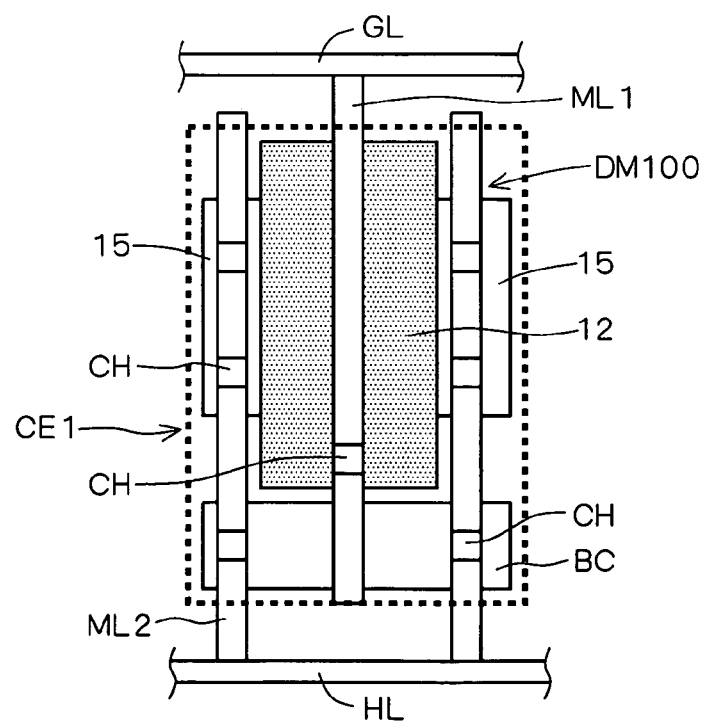
FIG. 27 to 29 are plan views showing the structure of the primitive cell of a decoupling capacitor.
Figure 28:
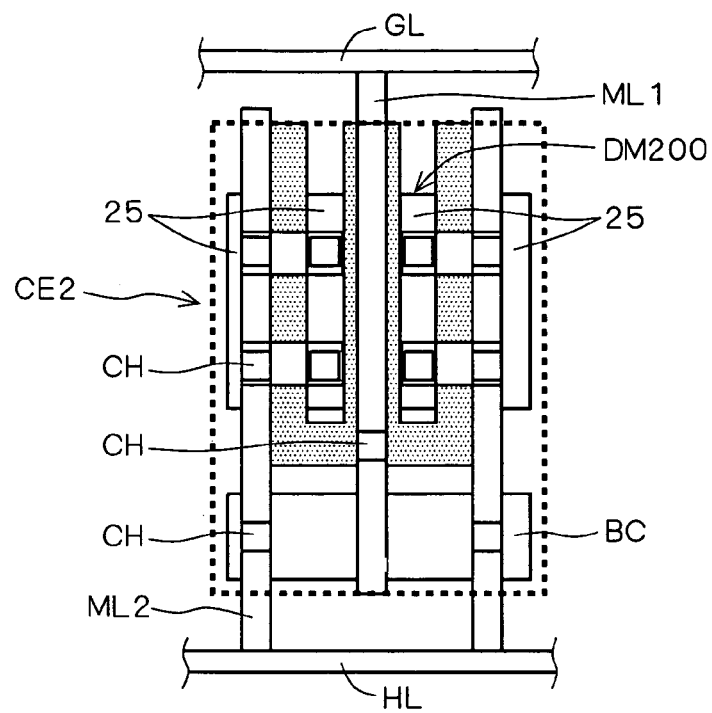
Figure 29:
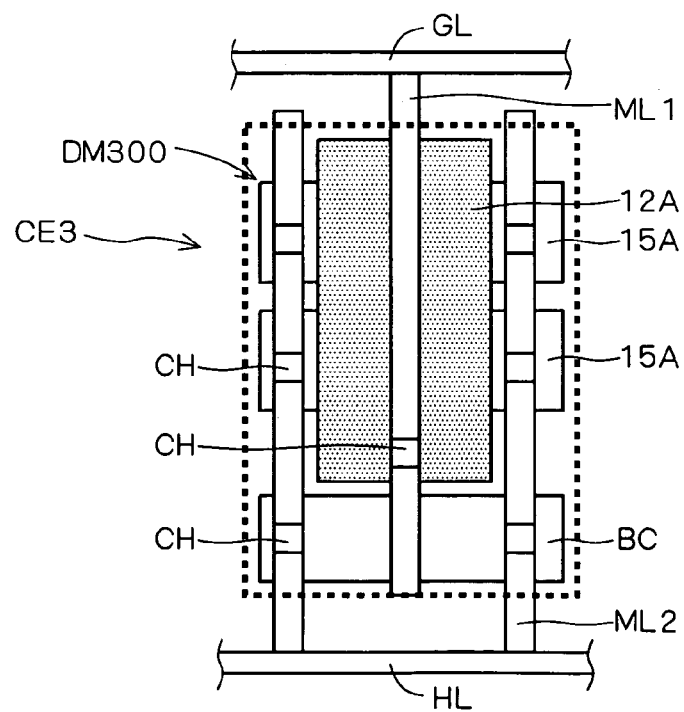

FIG. 27-FIG. 29 show the example of structure of a primitive cell including the decoupling capacitor from which a kind differs, respectively.

FIG. 27 shows primitive cell CE1 including one decoupling capacitor DM100 corresponding to decoupling capacitor DM1 shown in FIG. 1 and FIG. 2. About the same structure as decoupling capacitor DM1, the same numerals are attached and the overlapping explanation is omitted.

FIG. 28 shows primitive cell CE2 including three decoupling capacitors DM200 corresponding to decoupling capacitor DM2 shown in FIG. 1 and FIG. 2. About the number of DM200, it is an example and is not limited to this. About the same structure as decoupling capacitor DM2, the same numerals are attached and the overlapping explanation is omitted.

Source/drain layer 15 is connected to wiring ML2 in FIG. 27. Body contact region BC is formed in one outside of an end portion of the gate width direction of gate electrode 12, and body contact region BC is also connected to wiring ML2 via contact part CH.

Here, body contact region BC is an impurity region for fixing the electric potential of the body region. Body contact region BC is electrically connected with the body region via SOI layer 3 (FIG. 2) which remains under partial trench isolation insulating layer PT (FIG. 2). This structure is the same also in FIG. 28 and FIG. 29.

As shown in FIG. 28, the gate length of gate electrode 22 of decoupling capacitor DM200 is formed more narrowly than the gate length of decoupling capacitor DM100 which is shown in FIG. 27, but both of gate width are the same.

And each end portion of one side is connected in common, three gate electrodes 22 have E letter-like plane shape, and contact part CH is formed in the common part concerned.

Each decoupling capacitor DM200 has the structure which reduced the arrangement areas of the source/drain layer by using mutual source/drain layer 25 in common. Each source/drain layer 25 is connected to wiring ML2 by each, and each gate electrode is connected to wiring ML1.

FIG. 29 shows primitive cell CE3 including two decoupling capacitors DM300 which have gate electrode 12A which made gate width the half of gate electrode 12. About the number of DM300, it is an example and is not limited to this.

Although gate electrode 12A is one gate electrode substantially, since it has electrically separated source/drain layer 15A, respectively, it can be treated as two decoupling capacitors DM300.

These primitive cells CE1-CE3 have the same dimension in vertical x width (gate width direction×gate length direction). Therefore, it is easy to locate combining the things of a different kind or to collect and arrange only the things of the same kind. They can be located efficiently in the open area between circuit blocks. Also when alteration of the design and trouble of operation are discovered, there is also an advantage that revision of the mask is easy.

The decoupling capacitor which forms capacitor array HA for high-speed circuits is not limited to two kinds. As long as the tradeoff relation of area efficiency and frequency characteristics is improvable, it may be made to combine two or more kinds of decoupling capacitors.

J. Modification 7

In the above explanation, it was explained connecting at least two kinds of decoupling capacitors between source line HL and ground line GL as fundamental structure in capacitor array HA for high-speed circuits. This was the structure of taking into consideration the tradeoff relation of area efficiency and frequency characteristics. However, when what is necessary is to attain only an improvement of the frequency characteristics in a high-speed circuit regardless of area efficiency, in capacitor array HA for high-speed circuits, it is also possible to form only from a decoupling capacitor with narrow gate length or a decoupling capacitor with narrow gate width. It cannot be overemphasized that what is necessary is just to form capacitor array LA for low-speed circuits from a decoupling capacitor whose gate length and/or gate width are wider than the decoupling capacitor of capacitor array HA for high-speed circuits also in this case.

What is claimed is:

1. A semiconductor device, comprising:
    a first circuit that operates on a first frequency and a second circuit that operates on a second frequency lower than the first frequency located over a semiconductor substrate;
    a first source line that gives operating voltage to the first circuit;
    a second source line that gives operating voltage to the second circuit;
    a ground line to which grounding electric potential is given; and
    at least two kinds of decoupling capacitors which are connected between the first source line and the ground line and which have an MOS structure;
    wherein regarding the at least two kinds of decoupling capacitors, at least one side between a gate length and a gate width of a gate electrode which forms the MOS structure is set as different length.

2. A semiconductor device according to claim 1, wherein the at least two kinds of decoupling capacitors are located in an external open area outside an arrangement region of the first and the second circuits over the semiconductor substrate, and/or an internal open area in the first circuit.

3. A semiconductor device according to claim 1, further comprising:
one kind of decoupling capacitor which is connected between the second source line and the ground line and which has an MOS structure.

4. A semiconductor device according to claim 2, wherein the first circuit has a plurality of circuit parts to which operating voltage is supplied by the first source line; and
when the at least two kinds of decoupling capacitors are located in the internal open area, the at least two kinds of decoupling capacitors are connected between the first source line of the circuit part, and the ground line.

5. A semiconductor device according to claim 4, wherein the at least two kinds of decoupling capacitors differ in the gate length of the gate electrode.

6. A semiconductor device according to claim 5, wherein the at least two kinds of decoupling capacitors have the same gate width of the gate electrode.

7. A semiconductor device according to claim 5, wherein the gate length's shorter one among the at least two kinds of decoupling capacitors is located at a location near the circuit part.

8. A semiconductor device according to claim 4, wherein the at least two kinds of decoupling capacitors differ in the gate width of the gate electrode.

9. A semiconductor device according to claim 8, wherein the at least two kinds of decoupling capacitors have the same gate length of the gate electrode.

10. A semiconductor device according to claim 8, wherein the gate width's shorter one among the at least two kinds of decoupling capacitors is located at a location near the circuit part.

11. A semiconductor device according to claim 4, wherein the at least two kinds of decoupling capacitors differ in the gate length and the gate width of the gate electrode.

12. A semiconductor device according to claim 1, wherein the at least two kinds of decoupling capacitors are MOS capacitors of an accumulation type whose conductivity type of an impurity of a region located between a source layer and a drain layer is a same as both.

13. A semiconductor device according to claim 1, wherein the at least two kinds of decoupling capacitors are MOS capacitors of an inversion type whose conductivity type of an impurity of a region located between a source layer and a drain layer differs with both.

14. A semiconductor device according to claim 1, wherein the semiconductor substrate is a SOI substrate which includes a silicon substrate, a buried oxide film located over the silicon substrate, and an SOI layer located over the buried oxide film.

15. A semiconductor device according to claim 1, wherein the at least two kinds of decoupling capacitors include two kinds of decoupling capacitors; and
an impurity concentration of the semiconductor substrate under a gate insulating film of a side of a larger area specified by a product of the gate length and the gate width of the gate electrode is lower than the decoupling capacitor of another side.

16. A semiconductor device according to claim 1, further comprising:
a MOS transistor located between each of the at least two kinds of decoupling capacitors, and the first source line, or the ground line;
wherein diode connection of the MOS transistor is made.

17. A semiconductor device according to claim 1, further comprising:
a resistance located between each of the at least two kinds of decoupling capacitors, and the first source line, or the ground line.

18. A semiconductor device according to claim 1, further comprising:
a capacitor located between each of the at least two kinds of decoupling capacitors, and the first source line.

19. A semiconductor device according to claim 18, wherein
the capacitor has an insulating layer covered each gate electrode upper part of the at least two kinds of decoupling capacitors.

20. A semiconductor device according to claim 1, further comprising:
a control circuit which is located between each of the at least two kinds of decoupling capacitors, and the first source line, receives a signal showing whether the first circuit is operating, and controls electric potential so that a voltage of the first source line is not applied to each of the at least two kinds of decoupling capacitors when the first circuit is not operating.

21. A semiconductor device according to claim 1, wherein each of the at least two kinds of decoupling capacitors is located in arranging a primitive cell including one or more decoupling capacitors of a same kind to the external open area and/or internal open area; and
the primitive cell is set up so that a size specified with a dimension of a gate width direction or a dimension of a gate length direction may become common.

22. A semiconductor device, comprising:
a first circuit that operates on a first frequency and a second circuit that operates on a second frequency lower than the first frequency located over a semiconductor substrate;
a first source line that gives operating voltage to the first circuit;
a second source line that gives operating voltage to the second circuit;
a ground line to which grounding electric potential is given;
a first decoupling capacitor that is connected between the first source line and the ground line and that has an MOS structure; and
a second decoupling capacitor that is connected between the second source line and the ground line and that has an MOS structure;
wherein the first decoupling capacitor is set up so that at least one side of a gate length and a gate width of a gate electrode which form the MOS structure is smaller than the second decoupling capacitor.

* * * * *